US007542370B2

(12) United States Patent
Yan et al.

(10) Patent No.: US 7,542,370 B2
(45) Date of Patent: *Jun. 2, 2009

(54) REVERSIBLE POLARITY DECODER CIRCUIT

(75) Inventors: Tianhong Yan, San Jose, CA (US); Luca G. Fasoli, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 35 days.

This patent is subject to a terminal disclaimer.

(21) Appl. No.: 11/618,844

(22) Filed: Dec. 31, 2006

(65) Prior Publication Data

US 2008/0159053 A1     Jul. 3, 2008

(51) Int. Cl.
*G11C 8/00* (2006.01)

(52) U.S. Cl. .......................... 365/230.06; 365/185.23; 365/189.09

(58) Field of Classification Search ............ 365/230.06, 365/189.09, 185.23, 185.18, 148
See application file for complete search history.

(56) References Cited

U.S. PATENT DOCUMENTS

| | | | |
|---|---|---|---|
| 5,911,062 A * | 6/1999 | Taki | 713/400 |
| 5,949,735 A | 9/1999 | Jeong | |
| 6,034,882 A | 3/2000 | Johnson et al. | |
| 6,420,215 B1 | 7/2002 | Knall et al. | |
| 6,490,218 B1 | 12/2002 | Vyvoda et al. | |
| 6,525,953 B1 | 2/2003 | Johnson | |
| 6,621,745 B1 | 9/2003 | Manea | |
| 6,856,572 B2 | 2/2005 | Scheuerlein et al. | |
| 6,859,410 B2 | 2/2005 | Scheuerlein et al. | |
| 6,879,505 B2 | 4/2005 | Scheuerlein | |
| 6,952,030 B2 | 10/2005 | Herner et al. | |
| 6,952,043 B2 | 10/2005 | Vyvoda et al. | |
| 7,054,219 B1 | 5/2006 | Petti et al. | |
| 7,142,471 B2 | 11/2006 | Fasoli et al. | |
| 7,177,169 B2 * | 2/2007 | Scheuerlein | 365/51 |
| 7,272,052 B2 | 9/2007 | Scheuerlein et al. | |
| 7,349,267 B2 * | 3/2008 | Kuroda | 365/189.09 |
| 2005/0052915 A1 | 3/2005 | Herner et al. | |
| 2005/0141329 A1 | 6/2005 | Beat | |
| 2005/0158950 A1 | 7/2005 | Scheuerlein et al. | |

(Continued)

OTHER PUBLICATIONS

U.S. Appl. No. 11/461,339 filed Jul. 31, 2006, entitled "Passive Element Memory Array Incorporating Reversible Polarity Word Line and Bit Line Decoders" by Luca G. Fasoli, Christopher J. Petti, and Roy E. Scheuerlein.

(Continued)

*Primary Examiner*—David Lam
(74) *Attorney, Agent, or Firm*—Zagorin O'Brien Graham LLP

(57) ABSTRACT

A reversible polarity decoder circuit is disclosed which is particularly suitable for implementing a multi-headed decoder structure, such as might be used for decoding word lines, and particularly in a 3D memory array. The decoder circuit provides an overdrive voltage bias to the gates of half-selected word line driver circuits to solidly maintain the half-selected word lines at an inactive level. If the memory array is biased at or near the breakdown voltage, this overdrive voltage may be greater than the breakdown voltage of the decoder transistors. However, in the embodiments described, the decoder circuit accomplishes this without impressing a voltage greater than the breakdown voltage across any of the decoder transistors, for either polarity of operation of the decoder circuit.

43 Claims, 21 Drawing Sheets

U.S. PATENT DOCUMENTS

| | | |
|---|---|---|
| 2006/0145193 A1 | 7/2006 | So et al. |
| 2006/0146639 A1 | 7/2006 | Fasoli et al. |
| 2006/0250836 A1 | 11/2006 | Herner et al. |
| 2006/0250837 A1 | 11/2006 | Herner et al. |
| 2007/0069276 A1 | 3/2007 | Scheuerlein et al. |
| 2007/0070690 A1 | 3/2007 | Scheuerlein et al. |
| 2007/0072360 A1 | 3/2007 | Kumar et al. |
| 2007/0090425 A1 | 4/2007 | Kumar et al. |

OTHER PUBLICATIONS

U.S. Appl. No. 11/461,364, filed Jul. 31, 2006, entitled "Method for Using a Passive Element Memory Array Incorporating Reversible Polarity Word Line and Bit Line Decoders" by Luca G. Fasoli, Christopher J. Petti, and Roy E. Scheuerlein.

U.S. Appl. No. 11/461,352, filed Jul. 31, 2006, entitled "Dual Data-Dependent Busses for Coupling Read/Write Circuits to a Memory Array" by Roy E. Scheuerlein and Luca G. Fasoli.

U.S. Appl. No. 11/461,369, filed Jul. 31, 2006, entitled "Method for Using Dual Data-Dependent Busses for Coupling Read/Write Circuits to a Memory Array" by Roy E. Scheuerlein and Luca G. Fasoli.

U.S. Appl. No. 11/461,359, filed Jul. 31, 2006, entitled "Memory Array Incorporating Two Data Busses for Memory Array Block Selection" by Roy E. Scheuerlein, Luca G. Fasoli, and Christopher J. Petti.

U.S. Appl. No. 11/461,372, filed Jul. 31, 2006, entitled "Method for Using Two Data Busses for Memory Array Block Selection" by Roy E. Scheuerlein, Luca G. Fasoli, and Christopher J. Petti.

U.S. Appl. No. 11/461,362, filed Jul. 31, 2006, entitled "Hierarchical Bit Line Bias Bus for Block Selectable Memory Array" by Roy E. Scheuerlein and Luca G. Fasoli.

U.S. Appl. No. 11/461,376, filed Jul. 31, 2006, entitled "Method for Using a Hierarchical Bit Line Bias Bus for Block Selectable Memory Array" by Roy E. Scheuerlein and Luca G. Fasoli.

U.S. Appl. No. 11/496,874, filed Jul. 31, 2006, entitled "Mixed-Use Memory Array" by Roy Scheuerlein.

U.S. Appl. No. 11/496,983, filed Jul. 31, 2006, entitled "Method for Using a Mixed-Use Memory Array" by Roy Scheuerlein.

U.S. Appl. No. 11/496,870, filed Jul. 31, 2006, entitled "Mixed-Use Memory Array With Different Data States" by Roy Scheuerlein and Christopher Petti.

U.S. Appl. No. 11/497,021, filed Jul. 31, 2006, entitled "Method for Using a Mixed-Use Memory Array With Different Data States" by Roy Scheuerlein and Christopher Petti.

U.S. Appl. No. 11/461,393, filed Jul. 31, 2006, entitled "Controlled Pulse Operations in Non-Volatile Memory" by Roy Scheuerlein.

U.S. Appl. No. 11/461,399, filed Jul. 31, 2006, entitled "Systems for Controlled Pulse Operations in Non-Volatile Memory" by Roy Scheuerlein.

U.S. Appl. No. 11/461,410, filed Jul. 31, 2006, entitled "High Bandwidth One-Time Field-Programmable Memory" by Roy Scheuerlein and Christopher J. Petti.

U.S. Appl. No. 11/461,419, filed Jul. 31, 2006, entitled "Systems for High Bandwidth One-Time Field-Programmable Memory" by Roy Scheuerlein and Christopher J. Petti.

U.S. Appl. No. 11/461,424, filed Jul. 31, 2006, entitled "Reverse Bias Trim Operations in Non-Volatile Memory" by Roy Scheuerlein and Tanmay Kumar.

U.S. Appl. No. 11/461,431, filed Jul. 31, 2006, entitled "Systems for Reverse Bias Trim Operations in Non-Volatile Memory" by Roy Scheuerlein and Tanmay Kumar.

U.S. Appl. No. 11/461,343, filed Jul. 31, 2006, entitled "Apparatus for Reading a Multi-Level Passive Element Memory Cell Array" by Roy E. Scheuerlein, Tyler Thorp, and Luca G. Fasoli.

U.S. Appl. No. 11/461,367, filed Jul. 31, 2006, entitled "Memory for Reading a Multi-Level Passive Element Memory Cell Array" by Roy E. Scheuerlein, Tyler Thorp, and Luca G. Fasoli.

U.S. Appl. No. 11/618,843, filed Dec. 31, 2006, entitled "Method for Using a Reversible Polarity Decoder Circuit," by Tianhong Yan, Luca G. Fasoli and Roy E. Scheuerlein.

Pirovano et al., "Electronic Switching in Phase-Change Memories," IEEE Transactions on Electronic Devices, vol. 51, No. 3, Mar. 2004, pp. 452-459 (8 pages).

Baek et al., "Multi-layer Cross-point Binary Oxide Resistive Memory (OxRRAM) for Post-NAND Storage Application," IEEE International Electron Devices Meeting Technical Digest, Dec. 2005, pp. 750-753 (4 pages).

Baek et al., "Highly Scalable Non-volatile Resistive Memory using Simple Binary Oxide Driven by Asymmetric Unipolar Voltage Pulses," IEEE International Electron Devices Meeting Technical Digest, Dec. 2004, pp. 587-590 (4 pages).

Hwang et al., "Writing Current Reduction for High-Density Phase-Change RAM," IEEE International Electron Devices Meeting Technical Digest, Dec. 2003, pp. 893-896 (4 pages).

International Search Report and Written Opinion mailed Apr. 28, 2008 in PCT Application No. PCT/US2007/088161, 13 pages.

* cited by examiner

REVERSIBLE POLARITY DECODER CIRCUIT

CROSS-REFERENCE TO RELATED APPLICATION(S)

This application is related to the following U.S. Application(s), each of which is incorporated by reference herein in its entirety:

U.S. application Ser. No. 11/618,843 entitled "Method for Using a Reversible Polarity Decoder Circuit" by Tianhong Yan, Luca G. Fasoli, and Roy E. Scheuerlein, filed on even date herewith.

BACKGROUND

1. Field of the Invention

The present invention relates to decoder circuits, and particularly those suitable for programmable memory arrays, and more particularly those suitable for semiconductor integrated circuit memory arrays incorporating passive element memory cells.

2. Description of the Related Art

Certain passive element memory cells exhibit re-writable characteristics. For example, in certain memory cells programming may be achieved by forwarding biasing the memory cell (e.g., with reference to the polarity of a diode therewithin) with a voltage of approximately 6-8V, while erase may be achieved by reverse biasing the memory cell with a voltage of approximately 10-14V. These high voltages require use of special high voltage CMOS transistors within the word line and bit line decoders. These high-voltage transistors do not scale well as the memory cell word line pitch and bit line pitch decrease. This is particularly problematic for 3D memory technology, in which the sheer density of word lines and bit lines exiting the array, and which must be interfaced with a word line and bit line driver, makes even more important the ability to provide decoder circuits compatible with ever smaller array line pitches, yet capable of impressing a sufficiently high voltage across a selected memory cell.

Such a forward set/reverse reset memory array requires voltages that may exceed the breakdown voltages (i.e., $BV_{DSS}$) of the high voltage transistors that fit efficiently on the side of the memory array, and which are available for implementing such decoder circuits. Such a memory array also requires row and/or column decoders that have dual polarity outputs (i.e., active low outputs for one mode, and active high outputs for another mode).

SUMMARY

As circuit technology continues to scale, it is increasingly important for the memory array to operate at or near the breakdown voltage of the transistors available for the word line and bit line drivers (i.e., the array line drivers). In a multi-headed decoder structure, such as might be used for decoding word lines, it is also desirable to provide an even higher voltage bias to the gates of half-selected word line driver circuits to solidly maintain the half-selected word lines at an inactive level. This leads to a desired voltage swing of the row decoder outputs that is greater than the voltage swing of the word line drivers themselves. When this desired voltage overdrive is combined with a dual polarity row decoder requirement, it is difficult to achieve such a voltage swing, for both decoder polarities, without encountering breakdown problems when operating in one or both of the output polarities. For example, a transmission gate circuit would break down when operated to achieve a voltage swing larger than the array itself if the array line drivers are operated at the breakdown voltage.

In general, the invention is generally directed to a decoder circuit for a memory array and methods for using such a decoder circuit. However, the invention is defined by the appended claims, and nothing in this section shall be taken as limiting those claims.

In one aspect, the invention provides a decoder circuit which, in certain embodiments, includes a first bias node for conveying a first selected voltage for a first mode of operation and a second selected voltage for a second mode of operation; a second bias node for conveying a first unselected voltage for the first mode of operation and a second unselected voltage for the second mode of operation; a plurality of decoder output driver circuits each respectively comprising: a decoder output node; a first coupling circuit for coupling the decoder output node, when selected, to the first bias node; a second coupling circuit coupled in series with a third coupling circuit, said second and third coupling circuits for coupling the decoder output node, when unselected in the first mode of operation, to the first unselected voltage conveyed on the second bias node and, when unselected in the second mode of operation, to the second unselected voltage conveyed on the second bias node, and for limiting the respective voltage across each of said second and third coupling circuits when the decoder output node is selected in each of the first and second modes of operation.

In another aspect, the invention provides a decoder circuit which, in certain embodiments, includes a first plurality of decoder output driver circuits, each respectively comprising: a first transfer gate circuit coupled between a respective decoder output node and a first bias node associated with the first plurality of decoder output driver circuits; a second transfer gate circuit coupled between a first intermediate node and a second bias node associated with the first plurality of decoder output driver circuits; and a third transfer gate circuit coupled between the decoder output node and the first intermediate node.

In yet another aspect, the invention provides a decoder circuit which, in certain embodiments, includes a first bias node for conveying a first selected voltage for a first mode of operation and a second selected voltage for a second mode of operation; a second bias node for conveying a first unselected voltage for the first mode of operation and a second unselected voltage for the second mode of operation; a plurality of decoder output driver circuits each respectively comprising: a decoder output node; select means for coupling the decoder output node, when selected, to the first bias node; unselect means for coupling the decoder output node, when unselected in the first mode of operation, to the first unselected voltage conveyed on the second bias node and, when unselected in the second mode of operation, to the second unselected voltage conveyed on the second bias node; and means for limiting the respective voltage across individual devices in the unselect means to a value less than the device breakdown voltage, when the difference between the respective selected and unselected voltages for a respective mode of operation is greater than the device breakdown voltage.

The invention in several aspects is suitable for integrated circuits having a memory array, for methods for operating such integrated circuits and memory arrays, for methods of making memory products incorporating such arrays, and for computer readable media encodings of such integrated circuits, products, or memory arrays, all as described herein in greater detail and as set forth in the appended claims. The described techniques, structures, and methods may be used alone or in combination with one another.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
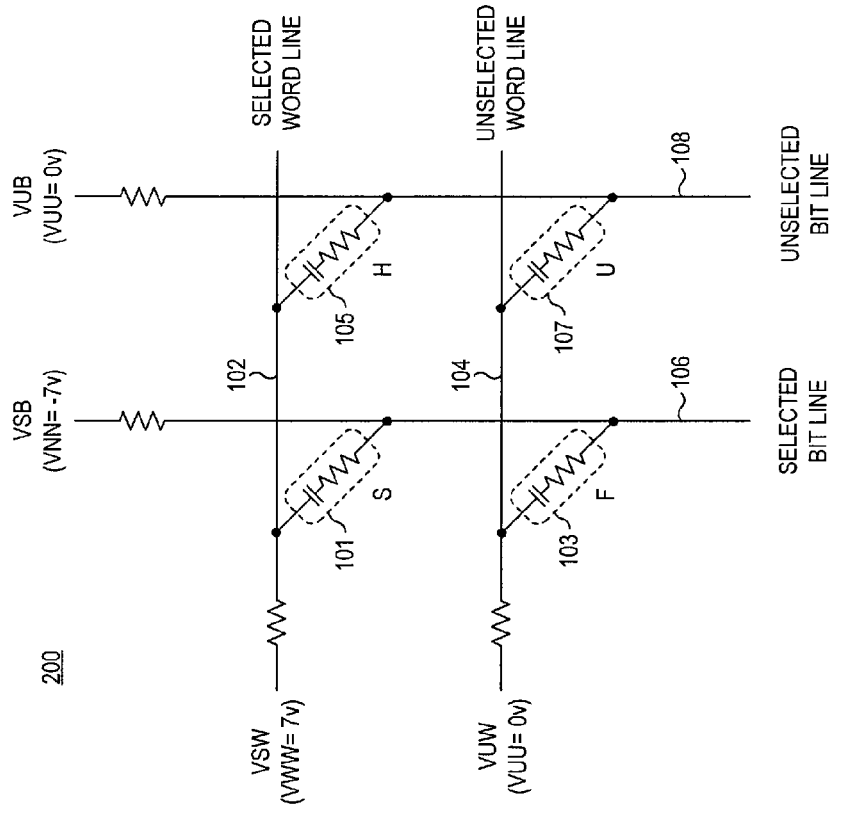
FIG. 1 is a schematic diagram of a memory array, illustrating selected and unselected word lines and bit lines, and exemplary array bias conditions for a set mode of operation.

In order to provide a basis for understanding the bias and voltage limitations of decoding circuitry for certain passive element memory arrays, a brief introduction is warranted. FIG. 1 is a schematic diagram of an exemplary passive element memory array 100. Two word lines 102, 104 are shown, as well as two bit lines 106, 108. Word line 102 is assumed to be a selected word line (SWL), and word line 104 is assumed to be an unselected word line (UWL). Similarly, bit line 106 is assumed to be a selected bit line (SBL), and bit line 108 is assumed to be an unselected bit line (UBL). Four passive element memory cells 101, 103, 105, 107 are shown, each coupled between an associated word line and an associated bit line.

Memory cell 101 is associated with the selected word line 102 and the selected bit line 106, and may be viewed as an "S" cell (i.e., "selected" cell). Memory cell 103 is associated with the unselected word line 104 and the selected bit line 106, and may be viewed as an "F" cell (i.e., "off" cell). Memory cell 105 is associated with the selected word line 102 and the unselected bit line 108, and may be viewed as an "H" cell (i.e., "half-selected" cell). Lastly, memory cell 107 is associated with the unselected word line 104 and the unselected bit line 108, and may be viewed as a "U" cell (i.e., "unselected" cell).

Also illustrating in FIG. 1 are exemplary biasing conditions for a set mode of operation (which may also be referred to as a "forward bias" mode of operation). As described elsewhere herein, such a set mode may be used for a programming mode, a block erase mode, and potentially other modes. As shown, the bias conditions may be viewed as appropriate for a programming mode of operation for a selected array block, and will be described as such.

The selected word line 102 is biased at a VSW voltage (e.g., a VNN voltage of −0.6 volts), the selected bit line 106 biased at a VSB voltage (e.g., a VWW voltage of +7.4 volts), the unselected word line 104 is biased at a VUW voltage (e.g., a VUU voltage of +6.8 volts), and the unselected bit line 108 biased at a VUB voltage (e.g., a VSS voltage of 0 volts). The VWW voltage coupled to the selected bit line may be viewed as an output voltage of a charge pump circuit.

Under these biasing conditions, the S cell 101 receives a forward bias voltage (i.e., a programming voltage "VPP") equal to +8 volts, the F cell 103 receives a forward bias voltage equal to the apparent threshold voltage of a memory cell, VT (e.g., +0.6 volts), the H cell 105 receives a forward bias voltage equal to VT (e.g., +0.6 volts), and the U cell 107 receives a reverse bias voltage equal to VPP−2VT (e.g., −6.8 volts). There are several exemplary memory cell technologies that, when biased under these conditions, the selected cell will be changed to a lower value of resistance, while the F, H, and U cells will not appreciably change in resistance. Exemplary cells are described herebelow.

Figure 2:
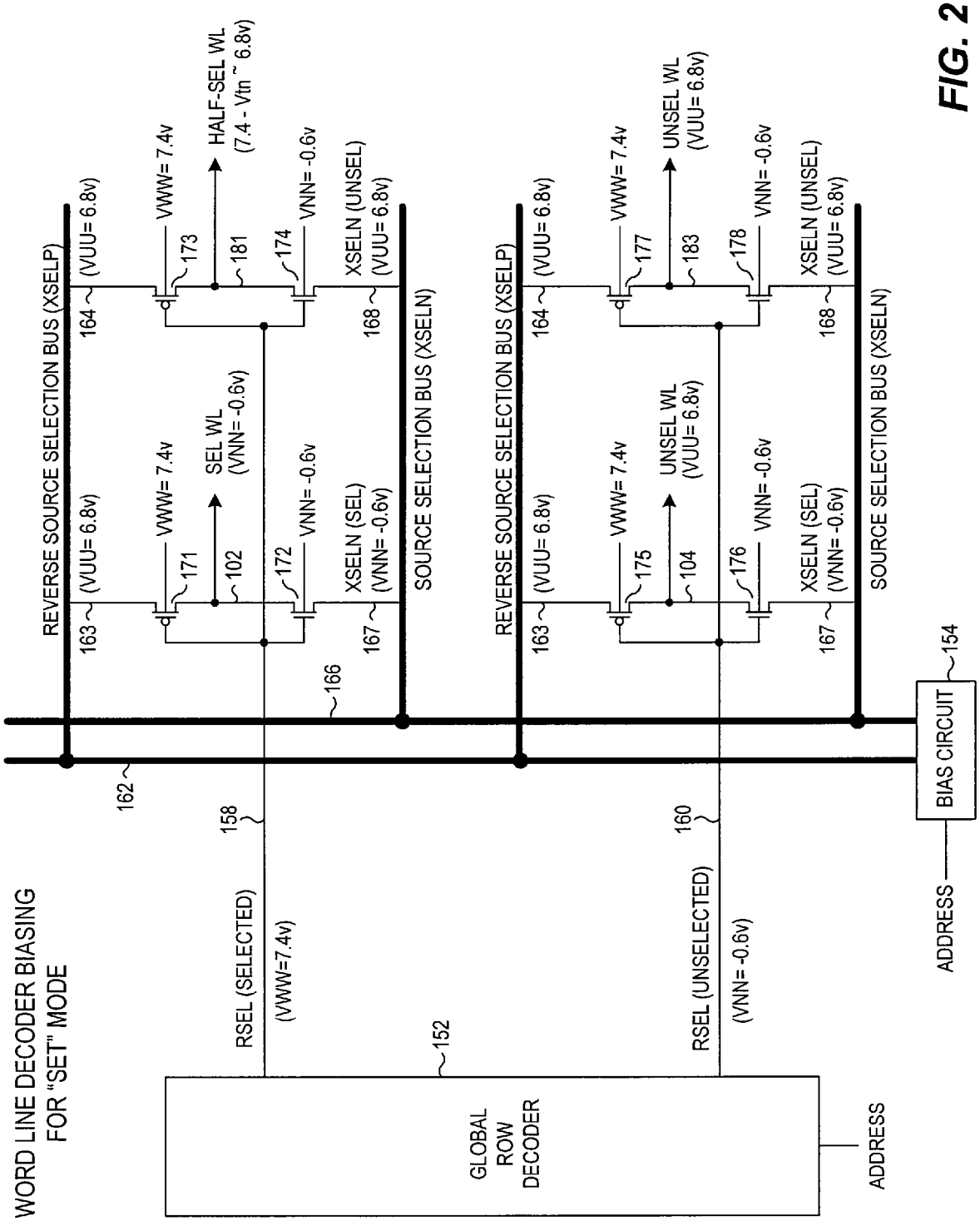
FIG. 2 is a schematic diagram of a word line decoder circuit, including exemplary bias conditions for a set mode of operation consistent with those shown in FIG. 1.

Referring now to FIG. 2, an exemplary word line decoder circuit is shown, including showing exemplary "set" bias conditions (as described in FIG. 1). A global row decoder circuit 152 is shown on the left side of the page, which shows two decoded RSEL (i.e., row select) outputs 158, 160. The decoded output 158 corresponds to a selected RSEL output, while the decoded output 160 corresponds to an unselected RSEL output. The global row decoder 152 generates a plurality of RSEL outputs, one of which is typically selected, and the remaining ones of which are unselected (collectively represented by the single output 160). In this mode of operation, the global row decoder 152 is an "active high" decoder, meaning that a selected RSEL output, such as decoded output node 158, is driven to the higher of two available voltage states, which in this case is VWW (e.g., 7.4 volts). The unselected decoded outputs, such as decoded output node 160, are driven to the lower of the two available voltage states, which in this case is VNN (e.g., −0.6 volts). The description that follows will initially assume that only one such decoded output node is selected at a time.

In an exemplary architecture, each of RSEL outputs is coupled to a respective group of word line driver circuits, thereby forming a multi-headed decoder. For example, RSEL node 158 is coupled to a word line driver circuit which includes PMOS transistor 171 and NMOS transistor 172. The respective drain terminal of transistors 171, 172 are both coupled to a word line, in this case representing the selected word line 102. A second word line driver circuit is also shown coupled to the RSEL node 158, which represents one or more remaining word line driver circuits associated with this particular RSEL output node 158. This second word line driver circuit includes PMOS transistor 173 and NMOS transistor 174, the output of which drives a word line 181 which represents one or more half-selected word lines.

The respective source terminals of the NMOS transistors in each of these word line driver circuits is coupled to a respective bus line of a source selection bus XSELN (also labeled 166). In this mode of operation, the source selection bus XSELN is decoded, based upon address information, so that one such XSELN bus line (e.g., bus 167) is biased at active state suitable for a word line for this mode of operation, while the remaining XSELN bus lines (e.g., bus line 168) are biased at an inactive state suitable for word lines for this mode of operation. In certain embodiments, more than one such source selection bus line may be active, but we shall for now assume that the bus line 167 is active, and is biased at −0.6 volts, while one or more remaining XSELN bus lines, represented by bus line 168, are inactive and are driven to the unselected word line voltage VUU (e.g., 6.8 volts).

Since the voltage on the selected RSEL output node 158 is higher than the voltage of bus lines 167, 168, both of the NMOS transistors 172, 174 are turned on, thus driving the selected word line 102 to −0.6 volts, and driving the half selected word line 181 to approximately 6.8 volts (strictly speaking, to a voltage that is equal to the RSEL voltage minus the threshold voltage of transistor 174, or the voltage of bus line 168, which ever is lower).

The respective source terminals of the PMOS transistors in each of these word line driver circuits is coupled to a corresponding bus line of a reverse source selection bus XSELP (also labeled 162). In this mode of operation, each of the XSELP bus lines conveys the unselected word line voltage VUW (e.g., the VUU voltage, 6.8 volts). Since the voltage on the selected RSEL output node 158 is higher than the voltage of the XSELP bus lines, both PMOS transistors 171, 173 are turned off.

The unselected RSEL output node 160 is coupled to a word line driver circuit which includes PMOS transistor 175 and NMOS transistor 176. The respective drain terminal of transistors 175, 176 are both coupled to a word line, in this case representing the unselected word line 104. A second word line driver circuit also coupled to the unselected RSEL output node 160 represents one or more remaining word line driver circuits associated with the unselected RSEL output node 160, and includes PMOS transistor 177 and NMOS transistor 178, the output of which drives an unselected word line 183.

As before, the respective source terminals of the NMOS transistors in each of these word line driver circuits is coupled to a respective bus line of a source selection bus XSELN. Since the voltage on decoded output node 160 (e.g., −0.6 volts) is at or lower than the voltage of XSELN bus lines 167, 168, both of the NMOS transistors 176, 178 are turned off. The respective source terminals of the PMOS transistors in each of these word line driver circuits is coupled to a corresponding bus line of the reverse source selection bus XSELP. Since the voltage on decoded output node 160 is lower than the voltage of these XSELP bus lines (by more than the PMOS threshold voltage), both PMOS transistors 175, 177 are turned on, thus driving the unselected word lines 104, 183 to VUU (e.g., 6.8 volts).

Figure 3:
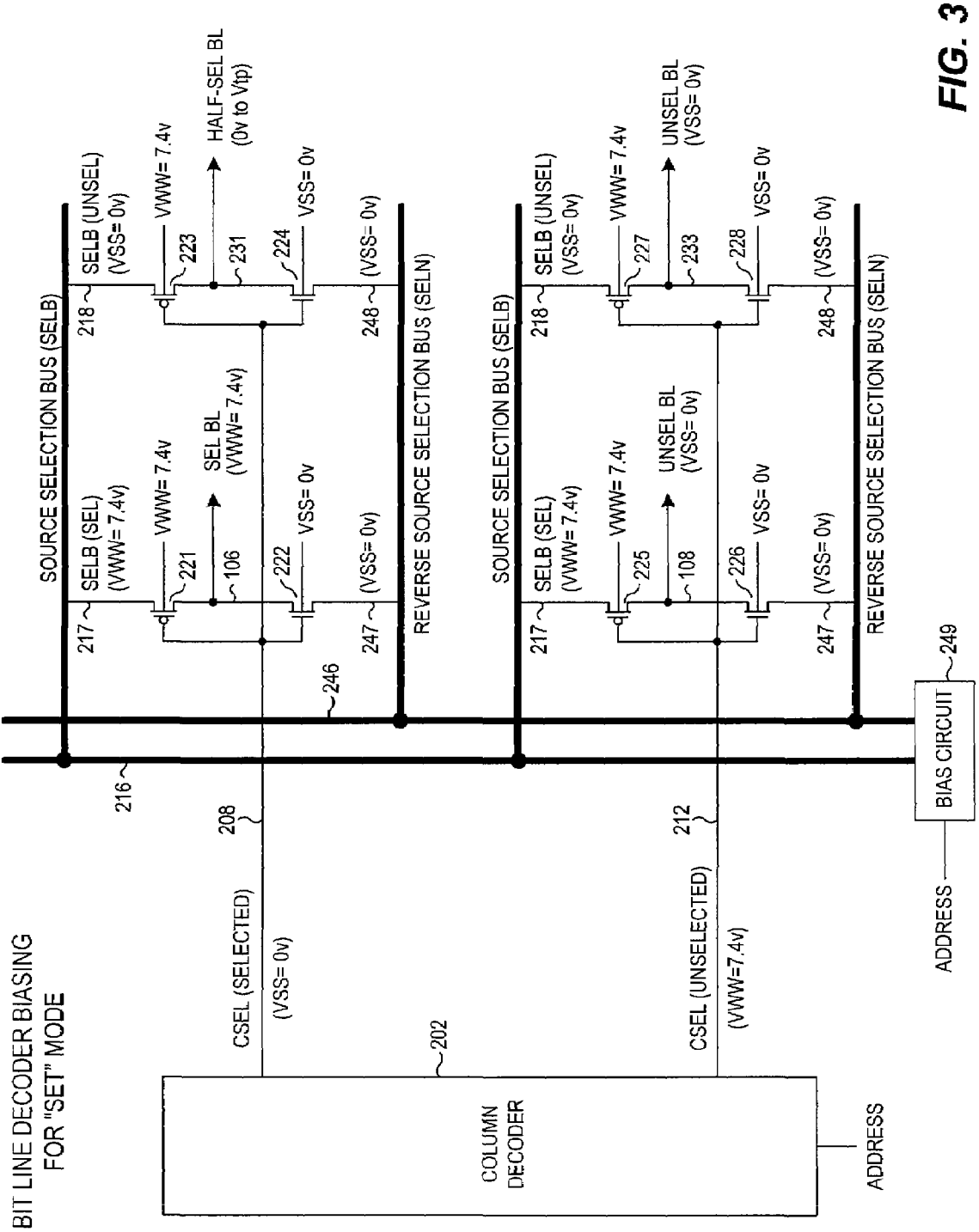
FIG. 3 is a schematic diagram of a bit line decoder circuit, including exemplary bias conditions for a set mode of operation consistent with those shown in FIG. 1.

Referring now to FIG. 3, an exemplary bit line decoder circuit is shown, including exemplary bias conditions suitable for the reset mode of operation (as described in FIG. 1). A column decoder circuit 202 is shown on the left side of the page, which shows two decoded CSEL (i.e., column select) outputs 208, 212. The decoded output 208 corresponds to a selected CSEL output, while the decoded output 212 corresponds to an unselected CSEL output. In this mode of operation, the column decoder is an "active low" decoder. The unselected decoded outputs, such as decoded output node 212, are driven to the higher of the two available voltage states, which in this case is VWW. The description that follows will initially assume that only one such decoded output node 208 is selected at a time.

As with the word line decoder described above, each of the CSEL outputs is coupled to a respective group of bit line driver circuits. For example, the selected CSEL output node 208 is coupled to a bit line driver circuit which includes PMOS transistor 221 and NMOS transistor 222. The respective drain terminal of transistors 221, 222 are both coupled to a bit line, in this case representing the selected bit line 106. A second bit line driver circuit is also coupled to the selected CSEL output node 208, which represents one or more remaining bit line driver circuits associated with this particular CSEL output node 208. This second bit line driver circuit includes PMOS transistor 223 and NMOS transistor 224, the output of which drives a bit line 231 which represents one or more half-selected bit lines. In contrast to the word line decoder, such a half selected bit line may represent a selected bit line which is being maintained in an inactive state.

The respective source terminals of the PMOS transistors in each of these bit line driver circuits is coupled to a respective bus line of a source selection bus SELB. In this mode of operation, the source selection bus SELB is data dependent, and may further be decoded based upon address information, so that one or more such SELB bus lines are biased at an active state suitable for a bit line for the reset mode of operation, while the remaining SELB bus lines are biased at an inactive state. In certain embodiments, more than one such source selection bus line may be active, but we shall for now assume that the SELB bus line 217 is active, and is biased at VWW (e.g., 7.4 volts), while one or more remaining SELB bus lines, represented by SELB bus line 218, are inactive and are driven to the unselected bit line voltage VUB (e.g., VSS).

With these bias conditions, both of the PMOS transistors 221, 223 are turned on, thus driving the selected bit line 106 to VWW. The half selected bit line 231 is constrained to rise to higher than a PMOS threshold voltage above the voltage of CSEL 208. Leakage in the memory array may also serve to maintain the voltage of such half-selected bit lines at or near VSS.

The respective source terminals of the NMOS transistors in each of these bit line driver circuits is coupled to a corresponding bus line of a reverse source selection bus SELN (also labeled 246). In this set mode of operation, each of the SELN bus lines conveys the unselected bit line voltage VUB (e.g., ground), and both of the NMOS transistors 222, 224 are turned off.

The unselected CSEL output node 212 is coupled to a bit line driver circuit which includes PMOS transistor 225 and NMOS transistor 226. The respective drain terminal of transistors 225, 226 are both coupled to a bit line, in this case representing the unselected bit line 108. A second bit line driver circuit also coupled to the unselected CSEL output node 212 represents one or more remaining bit line driver circuits associated with the CSEL output node 212, and includes PMOS transistor 227 and NMOS transistor 228, the output of which drives an unselected word line 233.

As before, the respective source terminals of the PMOS transistors in each of these bit line driver circuits is coupled to a respective bus line of a source selection bus SELB. Since the voltage on the unselected CSEL output node 212 (VWW) is at or above the voltage of the SELB bus lines 217, 218, both of the PMOS transistors 225, 227 are turned off. However, both NMOS transistors 226, 228 are turned on, thus driving the unselected bit lines 108, 233 to VSS.

Figure 4:
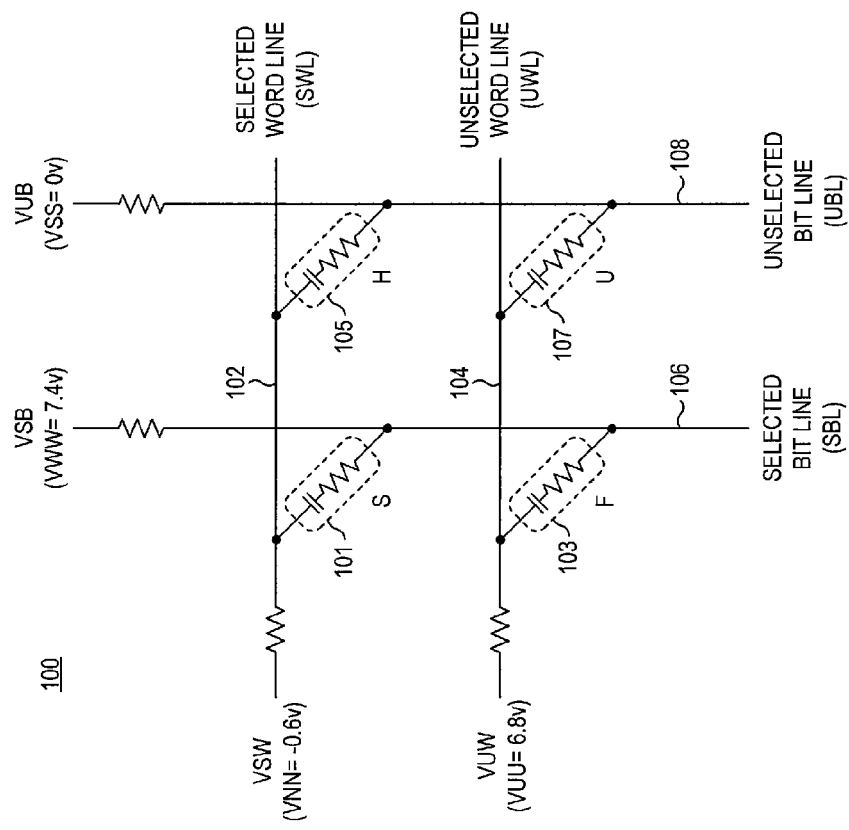
FIG. 4 is a schematic diagram of the memory array depicted in FIG. 1, but illustrating exemplary array bias conditions for a reset mode of operation.

Referring now to FIG. 4, exemplary biasing conditions 200 are shown for a reset mode of operation (which may also be referred to as a "reverse bias" mode of operation). As described elsewhere herein, such a reverse bias mode may be used for a programming mode or a block erase mode (although usually with different conditions for such different modes). As shown, the bias conditions may be viewed as appropriate for either a programming mode or erase mode of operation for a selected array block, and will be described as such.

Each of the bias conditions VSW, VUW, VSB, and VUB are now redefined for values appropriate for the present mode of operation. The selected word line 102 is biased at a VSW voltage of 7 volts (e.g., a VWW voltage), and the selected bit line 106 biased at a VSB voltage of −7 volts (e.g., a VNN voltage). The unselected word line voltage VUW and the unselected bit line voltage VUB are both ground (e.g., a VUU voltage). Under these biasing conditions, the S cell 101 receives a reverse bias voltage equal in magnitude to VWW−VNN (e.g., −14 volts), the F cell 103 receives a reverse bias voltage equal to VNN (e.g., −7 volts), and the H cell 105 receives a reverse bias voltage equal to VWW (e.g., −7 volts). Of note, the U cell 107 receives no bias across the cell.

There are several exemplary memory cell technologies (referenced below) that, when biased under these conditions, the selected cell will be changed from a lower value of resistance to a higher value of resistance, while the F, H, and U cells will not appreciably change in resistance. It should also be noted that the unselected U memory cells, which otherwise may support a considerable amount of leakage current when biased with several volts across such a cell, have no bias and therefore no leakage current. Many useful memory array embodiments include a far larger number of U cells than H cells of F cells, and such arrays will have significantly less leakage current in the unselected memory cells of the array, and hence much less power dissipation, than with other biasing schemes.

By "splitting" the reset voltage VRR, and biasing the SBL at a negative voltage equal to one half of the reset voltage, and biasing the SWL at a positive voltage equal to one half of the reset voltage, the voltage requirements of both the bit line decoder and the word line decoder are significantly relaxed. Consequently, consistent with the small pitch of the array lines (e.g., word lines and bit lines), the high voltage transistors in the array line driver circuits take up less area because they may be designed for a relatively lower "split" voltage.

Other memory technologies have faced similar issues regarding the programming and erase voltages (and the area needed for such high-voltage transistors) not scaling at the same rate as the memory cell pitch. For example, the impact of this issue in FLASH memory is somewhat reduced because of the larger fanout of typical FLASH-based memory arrays. The more space consuming design rules for high voltage transistors can be amortized in some newer technologies by increasing the memory block size. However, in a diode-based passive element memory array, larger block size comes at a cost of increased leakage through the unselected memory cells belonging to the selected array. By biasing such unselected cells as described in FIG. 4, this leakage component can be reduced to almost zero, and larger block sizes achieved with little deleterious power dissipation.

Figure 5:
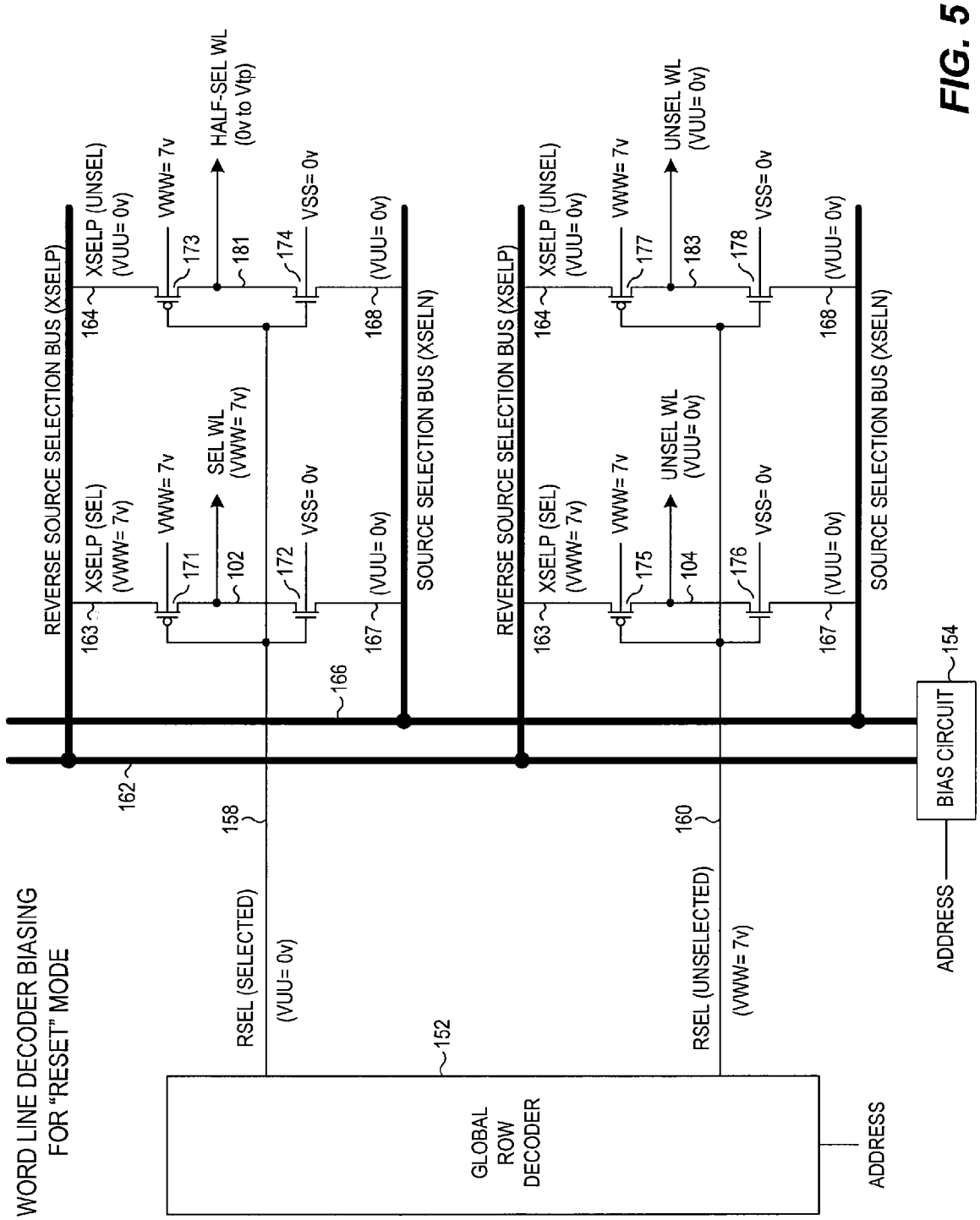
FIG. 5 is a schematic diagram of a word line decoder circuit, including exemplary bias conditions for a reset mode of operation consistent with those shown in FIG. 4.

Referring now to FIG. 5, the exemplary word line decoder circuit is shown including bias conditions suitable for the reset mode of operation just described. The selected RSEL output 158 of the global row decoder circuit 152 still corresponds to a selected decoded output, although in this reset mode the global row decoder 152 is an "active low" decoder, and the active (selected) RSEL output 158 is driven to the lower of two available voltage states, which in this case is GND (ground). The unselected RSEL outputs, such as output node 160, are now driven to the higher of the two available voltage states, which in this case is VWW for the reset mode (e.g., 7 volts).

In this mode of operation, for the exemplary embodiment described, the individual bus lines of the source selection bus XSELN are not decoded but are all driven to the same of bias condition (e.g., ground) suitable for unselected word lines.

However, the reverse source selection bus XSELP is decoded, and a selected XSELP bus line is driven to the VWW voltage suitable for a selected word line, and unselected XSELP bus lines are driven to the unselected word line bias voltage (e.g., ground). The voltage of each node is noted in the figure. With an understanding based on the description above regarding the set mode of operation, the operation of this circuit should be clear.

Figure 6:
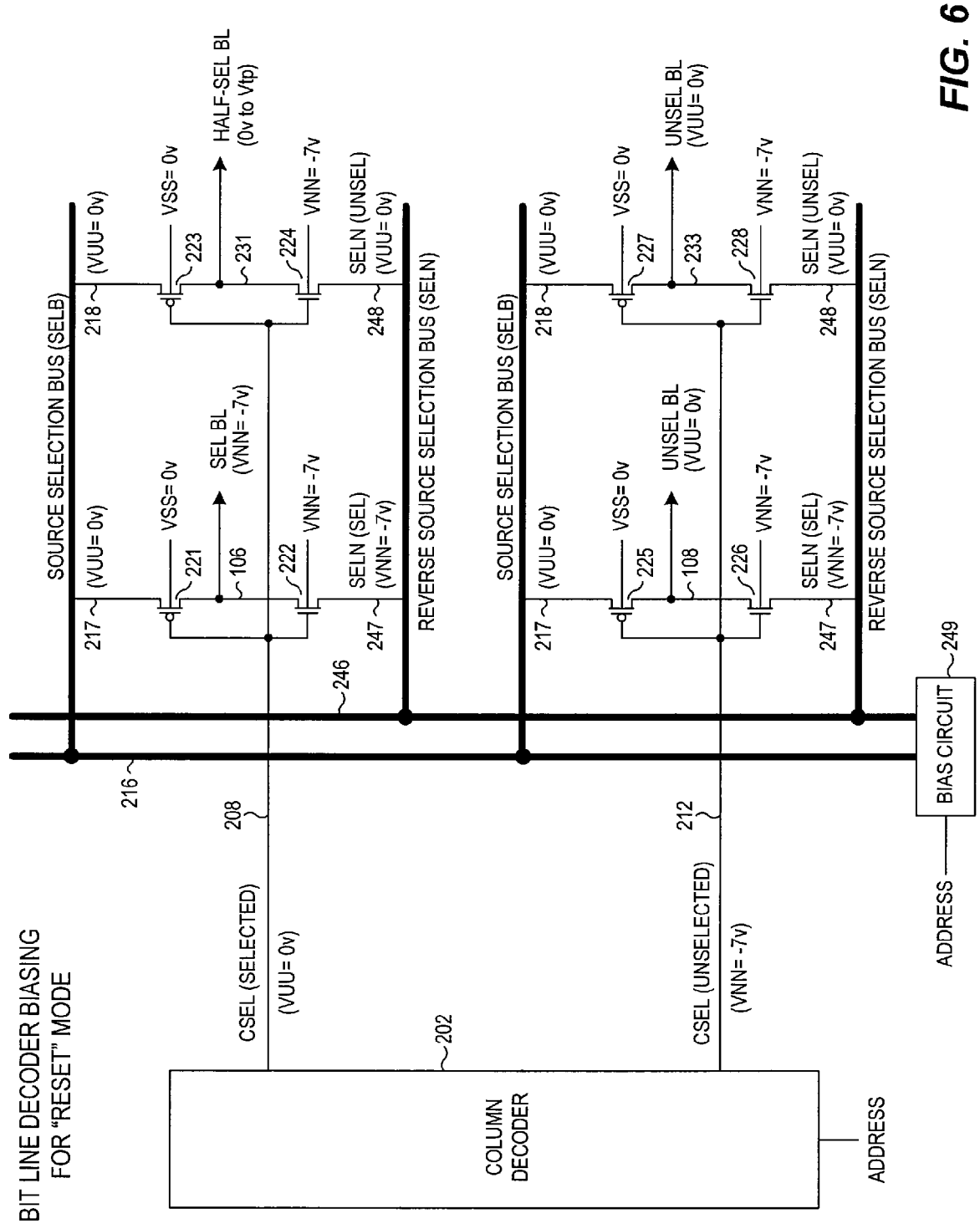
FIG. 6 is a schematic diagram of a bit line decoder circuit, including exemplary bias conditions for a reset mode of operation consistent with those shown in FIG. 4.

Referring now to FIG. 6, the exemplary bit line decoder circuit is shown including bias conditions suitable for the reset mode of operation just described. The decoded output 208 of the column decoder circuit still corresponds to a selected CSEL output, while the decoded output 212 corresponds to an unselected CSEL output. In this mode of operation, the column decoder is an "active high" decoder, and the active (selected) CSEL output 208 is driven to the higher of two available voltage states, which in this case is GND (ground). The unselected CSEL outputs, such as output node 212, are now driven to the lower of the two available voltage states, which in this case is the VNN voltage (e.g., −7 volts).

In this mode of operation, for the exemplary embodiment described, the individual bus lines of the source selection bus SELB are not decoded but are all driven to the same of bias condition (e.g., ground) suitable for unselected bit lines. However, the reverse source selection bus SELN is decoded, and a selected SELN bus line is driven to the VNN voltage suitable for a selected bit line, and unselected SELN bus lines are driven to the unselected bit line bias voltage (e.g., ground). The voltage of each node is noted in the figure, and operation of this circuit should be clear.

It should be noted that, in the set (or forward) mode, the column decoder is active low and the bit lines are active high. But in the reset (or reverse) mode, the column decoder reverses its polarity and becomes active high, while the bit lines themselves also reverse polarity and become active low. Conversely, in the set mode, the global row decoder is active high and the word lines are active low. But in the reset mode, the global row decoder reverses its polarity and becomes active low, while the word lines themselves also reverse polarity and become active high. In addition, both the row decoder and the column decoder output levels shift in average voltage between the set mode and the reset mode.

The above decoder circuits both utilize a decoded source selection bus and a decoded reverse source selection bus. This affords the flexibility to drive half-selected word lines or half selected bit lines to a respective unselected level. In other embodiments that may only be required to select a block of array lines in either the set or reset mode (such as a "block erase"), one of these decoded busses could be replaced by a single unselected bias line. Such a block operation avoids altogether any need for half-selected lines. The decoding implications can be very similar to that disclosed in U.S. Pat. No. 6,879,505 to Roy E. Scheuerlein, entitled "Word Line Arrangement Having Multi-Layer Word Line Segments for Three-Dimensional Memory Array", the disclosure of which is hereby incorporated by reference in its entirety. Whether such a block operation may be configured (or how large a block may be configured) largely rests upon the magnitude of the cell reset current, the number of cells conducting such reset current simultaneously, and whether the PMOS and NMOS transistors within the word line driver circuit and the bit line driver circuit can support such current with acceptable voltage drop. In addition, other similar decoding and biasing schemes of interest are disclosed in U.S. application Ser. No. 11/461,352 (filed Jul. 31, 2006, entitled "Dual Data-Dependent Busses for Coupling Read/Write Circuits to a Memory Array" by Roy E. Scheuerlein and Luca G. Fasoli., the disclosure of which is hereby incorporated by reference in its entirety.

The decoder circuits thus far described are useful for implementing memory arrays in which the memory cells include a reversible resistor plus a diode. Such memory cells maybe reset using a reverse bias applied across the cell, and providing for half-selected word lines and bit lines allows individual word lines and bit lines to be placed in a reset bias condition, thus providing the capability to reset individual memory cells without having to reset an entire block.

Figure 7:
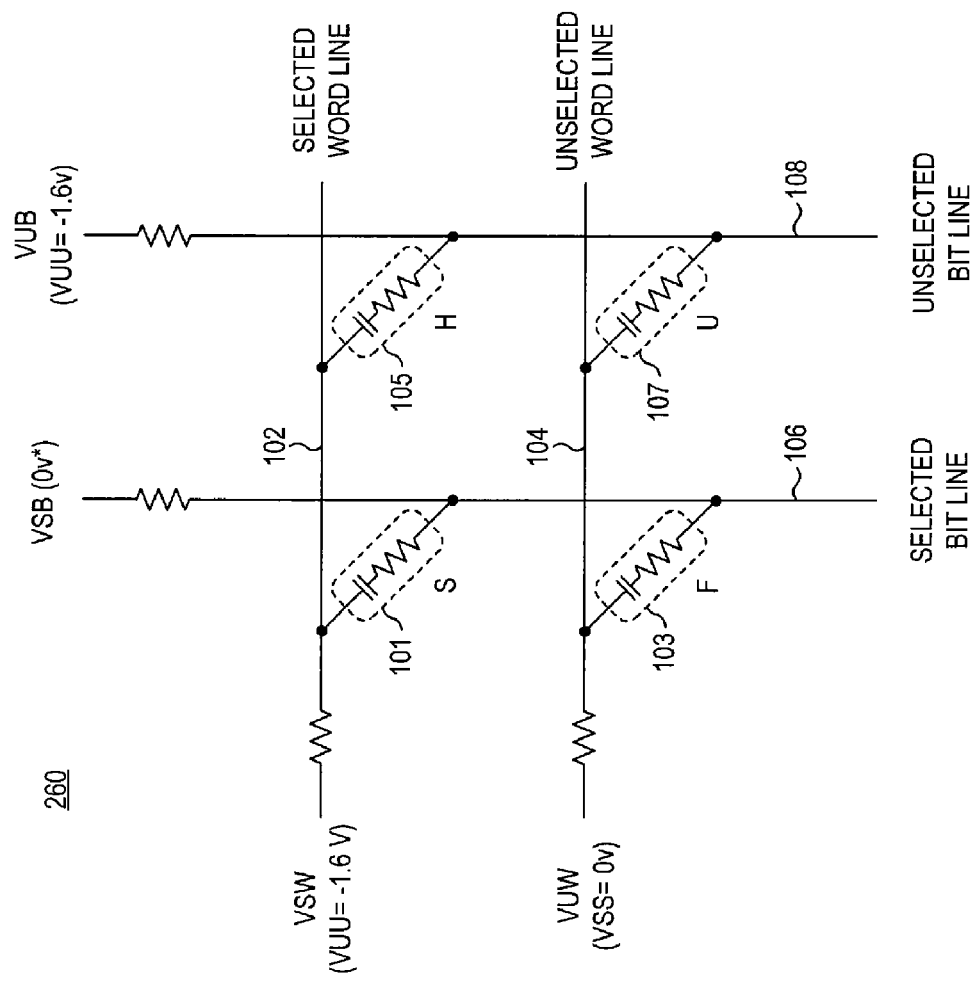
FIG. 7 is a schematic diagram of the memory array depicted in FIG. 1, but illustrating exemplary array bias conditions for a read mode of operation.

The forward mode was described above in the context of a programming condition, in which the voltage applied to the selected bit line (VWW) is almost the full programming voltage VPP. A forward bias mode is also applicable for a read mode, as depicted in FIG. 7.

Figure 8:
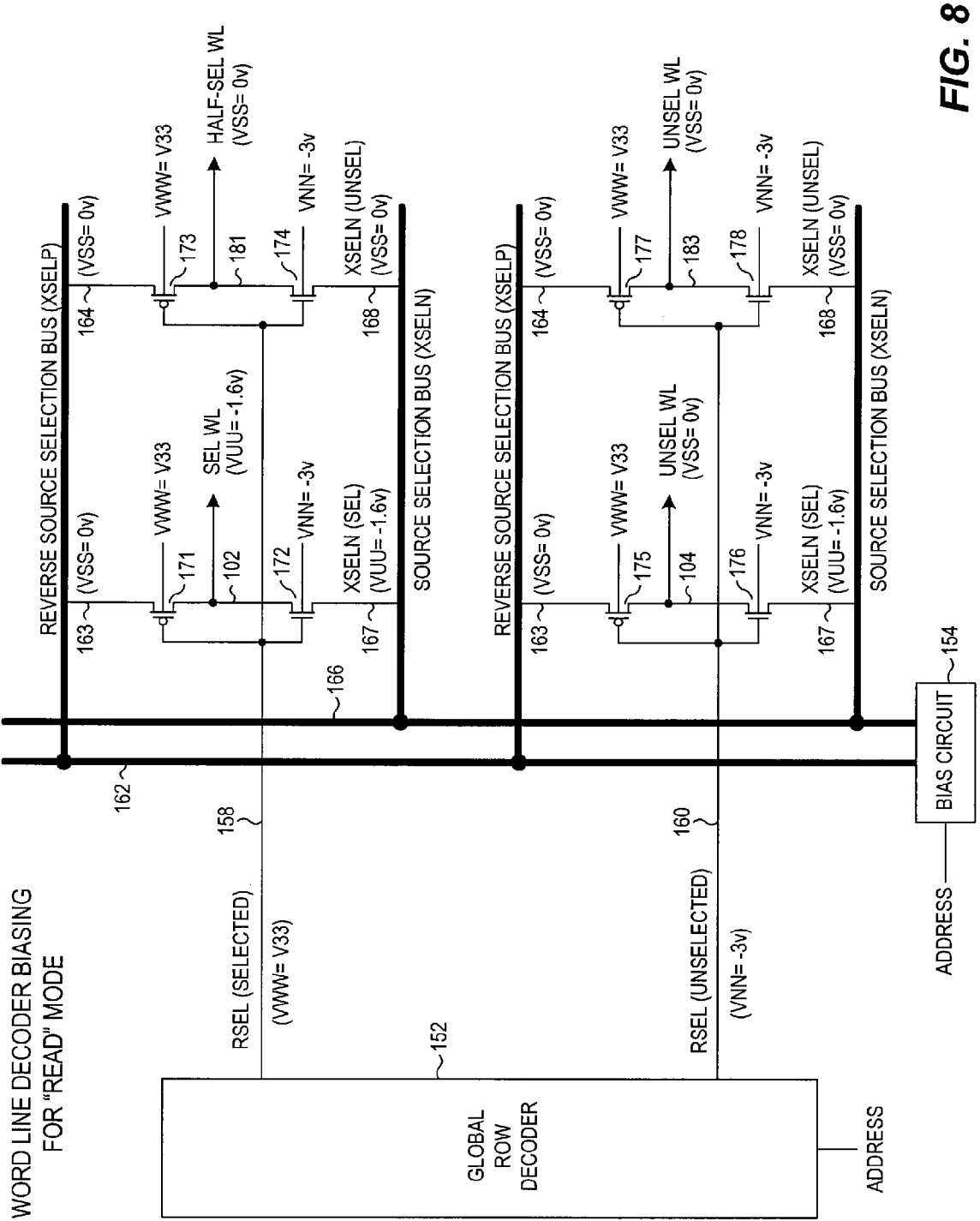
FIG. 8 is a schematic diagram of a word line decoder circuit, including exemplary bias conditions for a read mode of operation consistent with those shown in FIG. 7.
Figure 9:
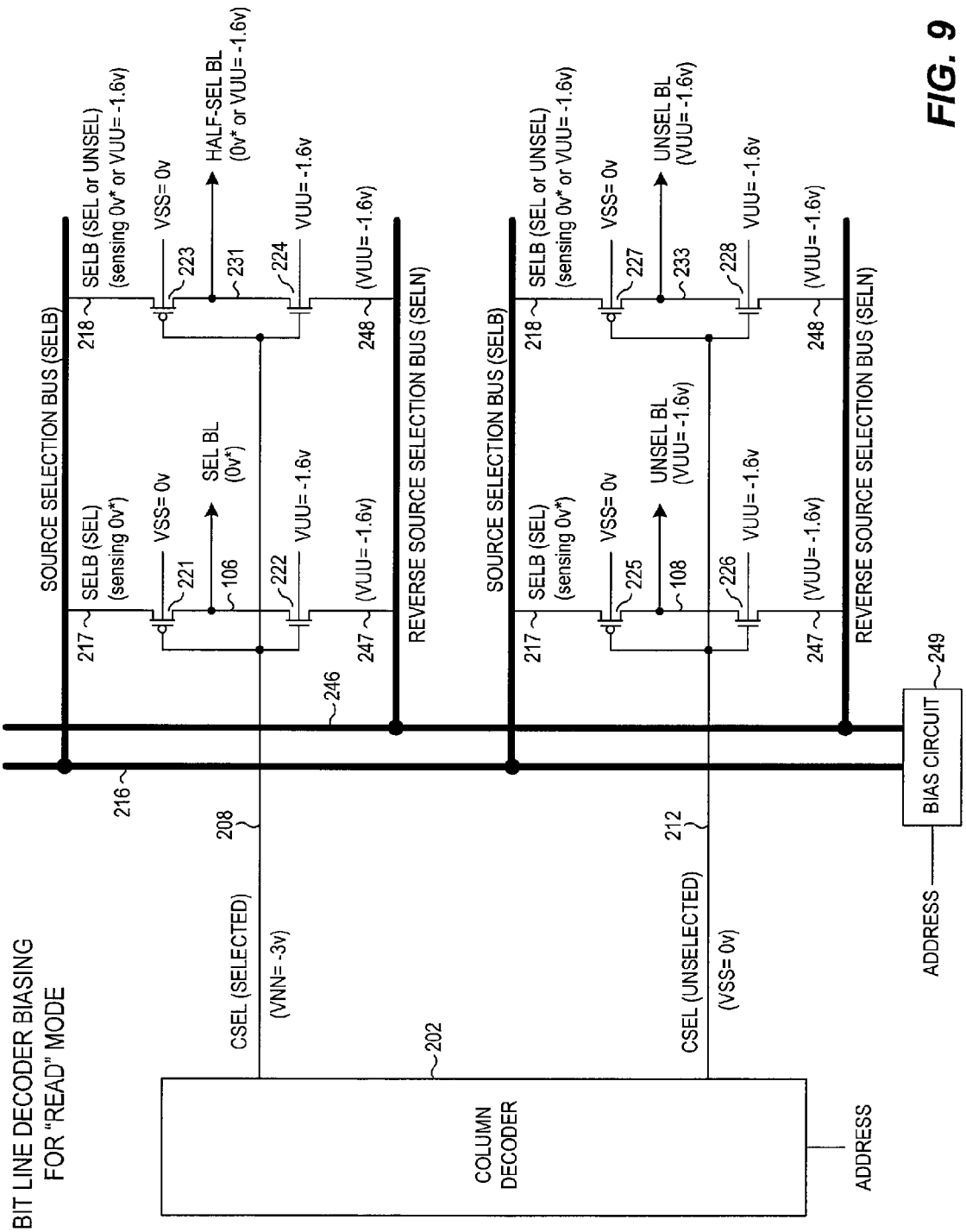
FIG. 9 is a schematic diagram of a bit line decoder circuit, including exemplary bias conditions for a read mode of operation consistent with those shown in FIG. 7.

An exemplary read mode of operation operates the decoders and the array at much lower voltages, and thus does not present the high voltage issues described above. Nonetheless, a few figures illustrating the read mode are included for completeness of this disclosure. FIG. 7 is a schematic diagram of the memory array depicted in FIG. 1, but illustrating exemplary array bias conditions for a read mode of operation. FIG. 8 depicts a word line decoder circuit, and FIG. 9 depicts a bit line decoder circuit, both including exemplary bias conditions for such a read mode of operation consistent with those shown in FIG. 7. The operation of such circuits in this read mode is clear from the descriptions presented above, but a few comments are noteworthy. The selected word line is driven to a negative voltage (e.g., −1.6 volts), and the unselected word lines remain at ground potential (e.g., VSS) which affords the opportunity of biasing the selected bit line also at ground. This reduces critical biasing requirements for the selected bit line when reading the selected bit line. In addition, sense amplifier structures may be implemented which load the SELB line (to which the selected bit line is coupled) so that a high bit line current will drive the SELB line below ground, while a low bit line current will allow the SELB line to rise above ground.

The biasing conditions for a standby mode of operation are also indicated in the various figures thus far. Such bias voltages facilitate a low power mode that maintains the array lines (i.e., bit lines, word lines) and other lines having significant capacitance (i.e., row select lines) at convenient standby voltages (e.g., ground). Such voltages are low in magnitude, and do not present any high voltage issues described herein.

Certain memory cells may be "programmed" using a forward bias mode, and block erased using the reverse mode. Other cells may be pre-conditioned (such as during manufacture) using an initial forward bias programming technique, but then are "programmed" using the reverse mode, and "erased" using the forward mode. To avoid confusion with historical usage in the programmable arts, and to comprehend different memory technologies that are contemplated for use with the decoder circuits described herein, three different modes of operation are useful to describe: read, set, and reset. In the read mode, a read voltage VRD is applied across a selected memory cell. In the set mode, a set voltage VPP is applied across a selected memory cell. In the exemplary embodiments thus far described, the read mode and the set mode are carried out using a forward mode of decoder operation. In the reset mode, a reset voltage VRR is applied across a selected memory cell. In the exemplary embodiments thus far described, the reset mode is carried out using a reverse mode of decoder operation. The reset mode described uses a split voltage technique to limit the voltage requirements for the decoder circuits, and drives a selected bit line to a negative voltage (i.e., using a triple well semiconductor structure, described below).

Many types of memory cells (described below) are capable of being programmed using the reset mode. In certain of these memory cell technologies, an antifuse within each memory cell is initially popped in the forward direction. Then the resistance of each memory cell is "tuned" in the reverse bias direction to accomplish programming. This would be the case for certain one-time-programmable cells. For re-writable cells, the cell is erased using the forward direction, which could be performed in a block of various sizes, and then programmed using the reverse mode.

The reverse bias is used to reset the selected memory cell. The programming current is supplied by a diode breakdown. In addition, the bias conditions associated with such programming may be carefully controlled, including controlling the voltage ramp of the selected word line and/or bit line. Additional insight into useful programming techniques maybe found in U.S. Pat. No. 6,952,030 referenced below. Multiple programming operations may be used to program various resistance states, as described in the 023-0049 and 023-0055 applications, referenced below, and as described in more detail in the MA-163-1 application, referenced below. The use of sloped programming pulses is described in the SAND-01114US0 and SAND-01114US1 applications, referenced below, and techniques for trimming the resistance of multiple cells is described in the SAND-01117US0 and SAND-01117US1 applications, referenced below.

The use of the reset programming as described above, for programming a passive element memory cell incorporating a trimmable resistive element, is particularly useful in providing great flexibility to allow for a larger array block size. Even in a selected array block (as all the descriptions above have assumed), there is no bias across the unselected memory cells in the reset mode, and therefore no wasted power dissipation. The reverse current through a cell (Irev) is not a concern for block size. Therefore many blocks may be selected to increase the write bandwidth. In addition, the voltage across each half selected memory cell is only one half of the programming voltage, and is safe for these cells.

It should be noted that in the descriptions above, the reset mode describes selected and half-selected word lines and bit lines. In the context of row selection, for example, such a half-selected word line may in fact be "not selected" by a given address, and such term is an artifact of the multi-headed word line driver structure. However, in the context of the bit lines, such a half-selected bit line may in fact be selected as far as the column address is concerned, but may be biased to an inactive state rather than the active state for the bit lines, either because the particular data for that bit line does not require "programming" the cell, or because the bit line is "waiting" to be programmed. This occurs when fewer than the number of bit line decoder heads are programmed at the same time. Of note, however, programming bandwidth concerns suggest configuring a memory array to simultaneously program as many bit lines as possible.

A triple well semiconductor structure (described in greater detail regarding FIG. 21 and FIG. 22) allows the selected bit line(s) to be taken to a negative voltage while the selected word line(s) is taken to a positive voltage. In the reset programming (i.e., reverse mode), the reference level for all unselected array lines (bit lines and word lines) is ground, which allows for rapid decoding and selection of both word lines and bit lines. Since the half-selected word lines and bit lines may be floating at or near ground, the resistive nature of the memory cells provides an additional leakage current between such half-selected array lines and the unselected array lines, which are actively held at the unselected bias level. This further encourages the unselected array lines to remain floating at or near the unselected bias potential.

Two-dimensional memory arrays are contemplated, but the decoder arrangements are believed particularly useful for a 3D memory array having multiple memory planes, as described below.

Figure 10:
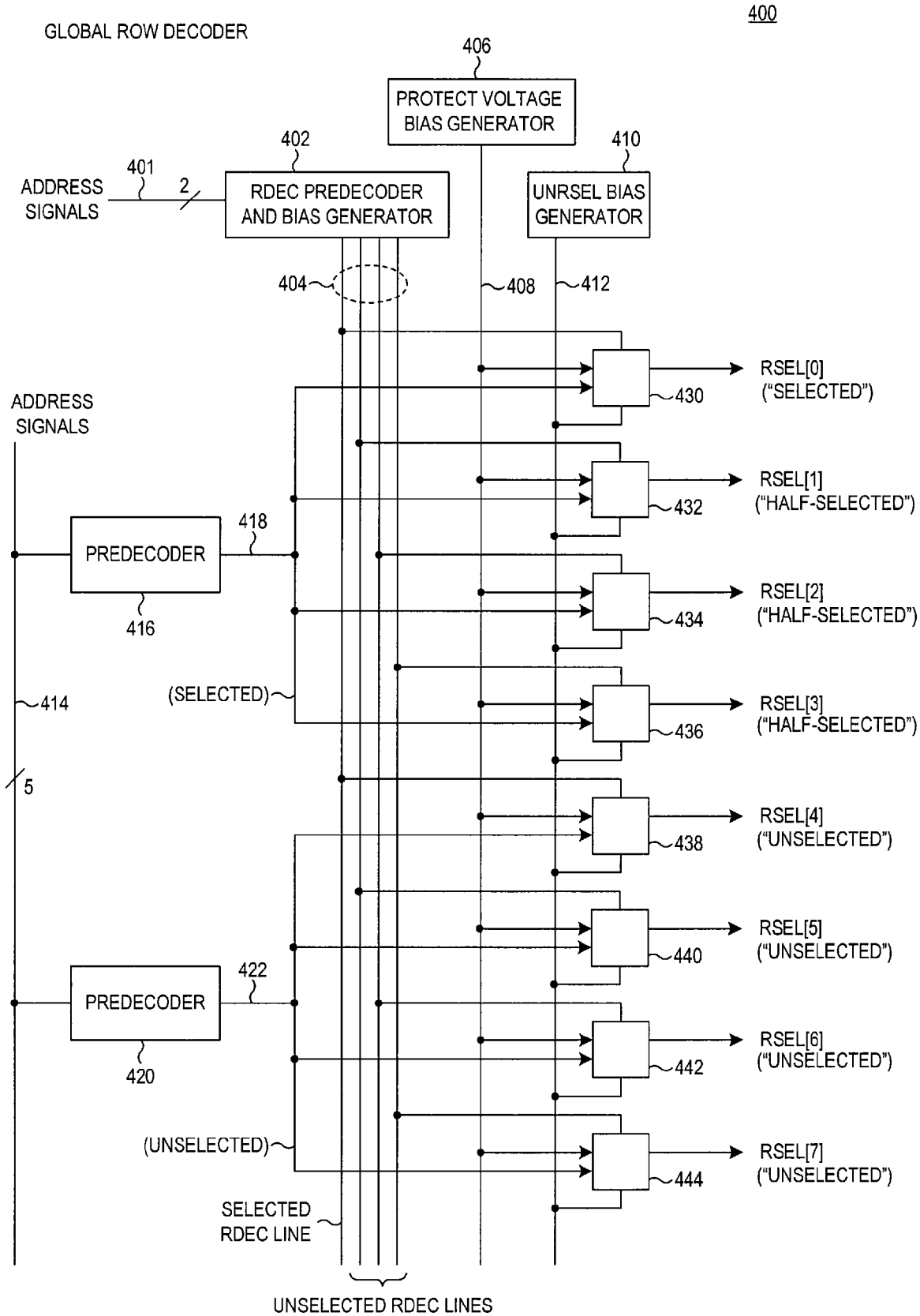
FIG. 10 is a block diagram of a dual polarity row decoder in accordance with an embodiment of the present invention.

Referring now to FIG. 10, a block diagram of a dual polarity row decoder 400 in accordance with an embodiment of the present invention is depicted. A total of eight separate RSEL (i.e., row select) outputs are shown, each generated by a respective one of eight decoder output driver circuits 430, 432, 434, 436, 438, 440, 442, and 444. In practice, many more such RSEL outputs would typically be implemented, but the eight shown here are sufficient to illustrate the structure of the row decoder 400.

In this exemplary embodiment, four different decoded RDEC lines 404 are shown. Each is generated by an RDEC decoder and bias generator 402, which is responsive to a group of address signals 401. Each decoder output driver circuit receives one of the four RDEC signals, and also receives an UNRSEL bias signal which is generated by a UNRSEL bias generator 410. In addition, each decoder output driver circuit receives one or more protect voltage signals 408 from a protect voltage bias generator 406, and lastly receives an output signal (e.g., output 418) from a corresponding row address predecoder (e.g., predecoder 416).

Each of the row address predecoders 416, 418 receive a different group of address signals from an address bus 414, as is known in the decoder arts. One of the predecoder outputs is selected, and the remaining ones are uselected, based upon the particular group of address signals (both true and complement versions of a plurality of address bits) that each predecoder receives. As shown here, predecoder output 418 represents a selected output, while predecoder output 422 represents an unselected output.

Of the four RDEC lines, the left-most one (labeled 404a) represents a selected RDEC line, and the other three RDEC lines 404b, 404c, and 404d are unselected. The decoder output driver circuit 430 (i.e., also referred to as a "decoder head") receives both a selected RDEC signal 404a and a selected predecoder output signal 418, its output RSEL[0] may be viewed as a "selected" RSEL line. The decoder output driver circuits 432, 434, 436 receive respective unselected RDEC signals 404b, 404c, and 404d, and the selected predecoder output signal 418, their respective outputs RSEL[1], RSEL[2], and RSEL[3] may be viewed as "half-selected" RSEL lines. Lastly, the decoder output driver circuits 438, 4440, 442, and 444 receive an unselected predecoder output signal 422, their respective outputs RSEL[4], RSEL[5], RSEL[6], and RSEL[7] may be viewed as "unselected" RSEL lines (irrespective of whether such driver circuit receives a selected or unselected RDEC signal). The rationale for such names is because a given decoder head couples its output to a "selected" bias line if the input to the decoder head is selected (i.e., driven to an active level). However, by no means does this imply that all four of the heads shown drive their respective outputs to a level that is reflective of the output being selected, because typically only one of the selected RDEC lines is actually biased in a condition suitable for a selected output, and the remaining three RDEC lines are biased in a condition suitable for an unselected output.

This figure is useful to establish certain terminology as applied to such a decoder circuit, and the operation of this circuit will be made clearer in light of the next several figures. As shown here, such a decoder may be viewed as a four-headed decoder circuit, although as will be described below, other numbers of decoder heads are contemplated in various embodiments. Description of similar array organizations and hierarchical decoder arrangements may be found in "Apparatus and Method for Hierarchical Decoding of Dense Memory Arrays Using Multiple Levels of Multiple-Headed Decoders," by Luca G. Fasoli, et al., U.S. Patent Application Publication No. 2006-0146639 A1, the disclosure of which is hereby incorporated by reference in its entirety, and particularly FIG. 6 and FIG. 7 therein.

Figure 11:
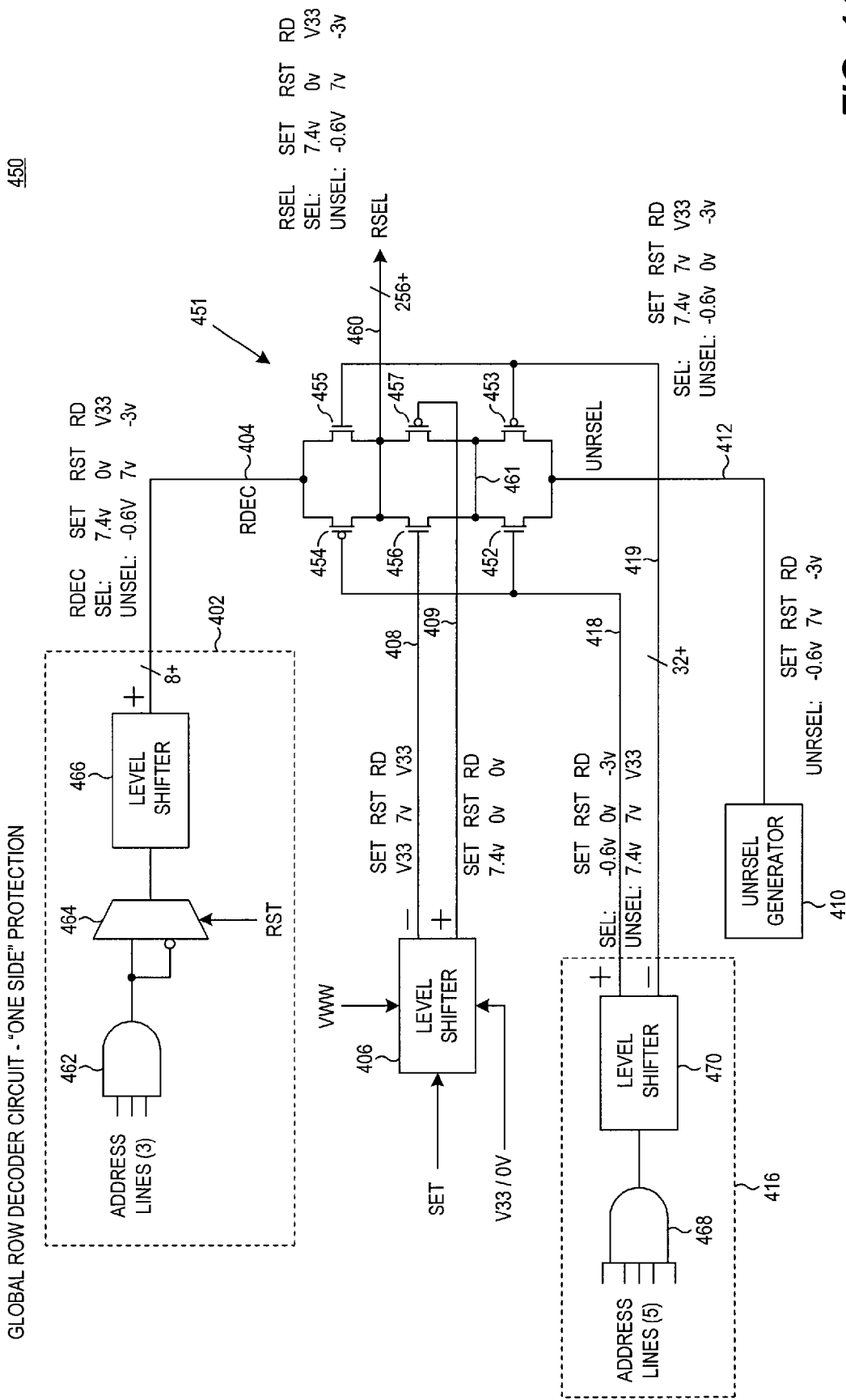
FIG. 11 is a block/schematic diagram of a dual polarity row decoder including an embodiment of a decoder output driver circuit in accordance with an embodiment of the present invention, and showing exemplary bias conditions for several modes of operation.

Referring now to FIG. 11, a block diagram of a dual polarity row decoder 450 is shown which is generally consistent with that shown in FIG. 10 (although a few differences will be noted), along with a schematic diagram of a decoder output driver circuit 451, in accordance with an embodiment of the present invention. The figure also shows exemplary bias conditions for each of several nodes, for each of several modes of operation.

The RDEC decoder and bias generator 402 in this figure decodes eight different RDEC lines, rather than four as described above. For each of the eight RDEC lines, an AND gate 462 receives a unique combination of three address signal lines to decode an active-high output, which is then conditionally inverted by multiplexer 464 in the reset mode, then level-shifted by level shifter 466 to generate a given one of eight different RDEC lines 404. The AND gate 462, multiplexer 464, and level-shifter 466 are repeated (obviously with different unique combinations of the three address signal lines) to generate each of the eight RDEC lines 404. Exemplary bias conditions for both selected and unselected RDEC lines are shown for each of the set, reset, read, and standby modes of operation.

The protect voltage bias generator 406 shown in FIG. 10 is shown here as a level shifter circuit which receives a VWW voltage (i.e., typically a high voltage output of a charge pump circuit), a V33 voltage (e.g., a 3.3 volt power supply voltage), and 0 volt power supply voltage, and a SET signal, and generates two somewhat complementary outputs 408, 409. Exemplary bias conditions for such outputs 408, 409 are shown for each of the set, reset, read, and standby modes of operation.

The address predecoder 416 shown in FIG. 10 is shown here as an AND gate 468 (responsive to a group of five address lines), and a level shifter circuit 470 which generates two somewhat complementary decoder outputs 418, 419. The address predecoders 416 shown in this figure decodes 32 (or more) pairs of decoded outputs 418, 419. For each of the decoded complementary pairs of outputs, a respective AND gate 468 receives a unique combination of five (or more) address signal lines to decode an output, which is then level shifted to generate the decoder outputs 418, 419. The AND gate 468, and level-shifter 470 are repeated (obviously with different unique combinations of the address signal lines) to generate each of the thirty-two pairs of decoder output lines 418, 419. Exemplary bias conditions for both selected and unselected pairs of decoded outputs 418, 419 are shown for each of the set, reset, read, and standby modes of operation.

The UNRSEL bias generator 410 shown in FIG. 10 is shown again here, and generates an UNRSEL signal on node 412. Exemplary bias conditions for the UNRSEL bias node are shown for each of the set, reset, read, and standby modes of operation.

Lastly, each decoder output driver circuit 451 generates a respective RSEL output node 460. Based upon the exemplary bias conditions as shown for the various inputs to this decoder output driver circuit 451, the corresponding exemplary bias conditions for both selected and unselected RSEL nodes are shown, for each of the set, reset, read, and standby modes of operation.

Each decoder output driver circuit 451 includes three coupling circuits: the first coupling circuit is formed by transistors 454 and 455 (which may also be thought of as a transfer gate), the second coupling circuit is formed by transistors 452 and 453, and the third coupling circuit is formed by transistors 456 and 457. The first coupling circuit may be viewed as coupling the decoder output node RSEL, when selected, to the corresponding RDEC line for the decoder output driver circuit. Such is true for both the set and reset modes of operation, even though the polarity of the voltages on the RDEC lines reverses. The second coupling circuit may be viewed as coupling the decoder output node RSEL, when unselected, to the UNRSEL line coupled to the decoder output driver circuit. Likewise, such is also true for both the set and reset modes of operation, even though the polarity of the voltage on the UNRSEL line reverses between these modes of operation. Lastly, the third coupling circuit, which is coupled between the RSEL output node and the second coupling circuit, may be viewed as limiting the voltage across the second coupling circuit when the RSEL output is selected in the set mode of operation, and as driving the RSEL output when unselected in the reset mode of operation to the UNRSEL line.

The RDEC line coupled to a given decoder output driver circuit 451 may be viewed as a first bias node for conveying a first selected voltage for a first mode of operation and a second selected voltage for a second mode of operation. For example, the RDEC line conveys a high (e.g., 7.4 v) selected voltage during the set mode of operation, and a low (e.g., 0 v) selected voltage for the reset mode of operation. The UNRSEL line coupled to a given decoder output driver circuit 451 may be viewed as a second bias node for conveying a first unselected voltage for the first mode of operation and a second unselected voltage for the second mode of operation. For example, the UNRSEL line conveys a low (e.g., −0.6 v) unselected voltage for the set mode of operation, and a high (e.g., 7 v) unselected voltage for the reset mode of operation.

During the set mode of operation, the protect voltage conveyed on node 408 is an intermediate voltage, such as V33 (e.g., a 3.3 volt power supply voltage). Since this voltage is coupled to the NMOS transistor 456 of the third coupling circuit, the output voltage is "divided" down so that a voltage larger than the BVDSS of transistors 452 and 453 is not impressed across such transistors. In other words, the protect voltage 408 coupled to the third coupling circuit limits the voltage impressed across the second coupling circuit. During the set mode, the complement protect voltage conveyed on node 409 is high (e.g., 7.4 volts), and thus the PMOS transistor 457 is turned off. (See FIG. 12, driver 430, to illustrate this condition.)

During reset mode of operation, the PMOS transistor 457 is turned on by the low voltage (e.g., 0 volts) conveyed on protect node 409 to fully pass the reset high voltage (e.g., 7 volts conveyed on the UNRSEL line 412) to the unselected RSEL outputs. (See FIG. 13, driver 438, to illustrate this condition.) In the circuit shown, the reset high voltage is limited to a magnitude no higher than the BVDSS of the transistors, which prevents the transistors 454, 455 in the first coupling circuit from breaking down. Thus, this circuit 450 may be viewed as a "one side" protection decoder output driver circuit, since the lower (i.e., second) coupling circuit is protected from breakdown for a high selected output that is greater than the breakdown voltage, but the upper (i.e., first)

coupling circuit is not protected, and thus the reset high voltage should not exceed the breakdown voltage.

Figure 12:
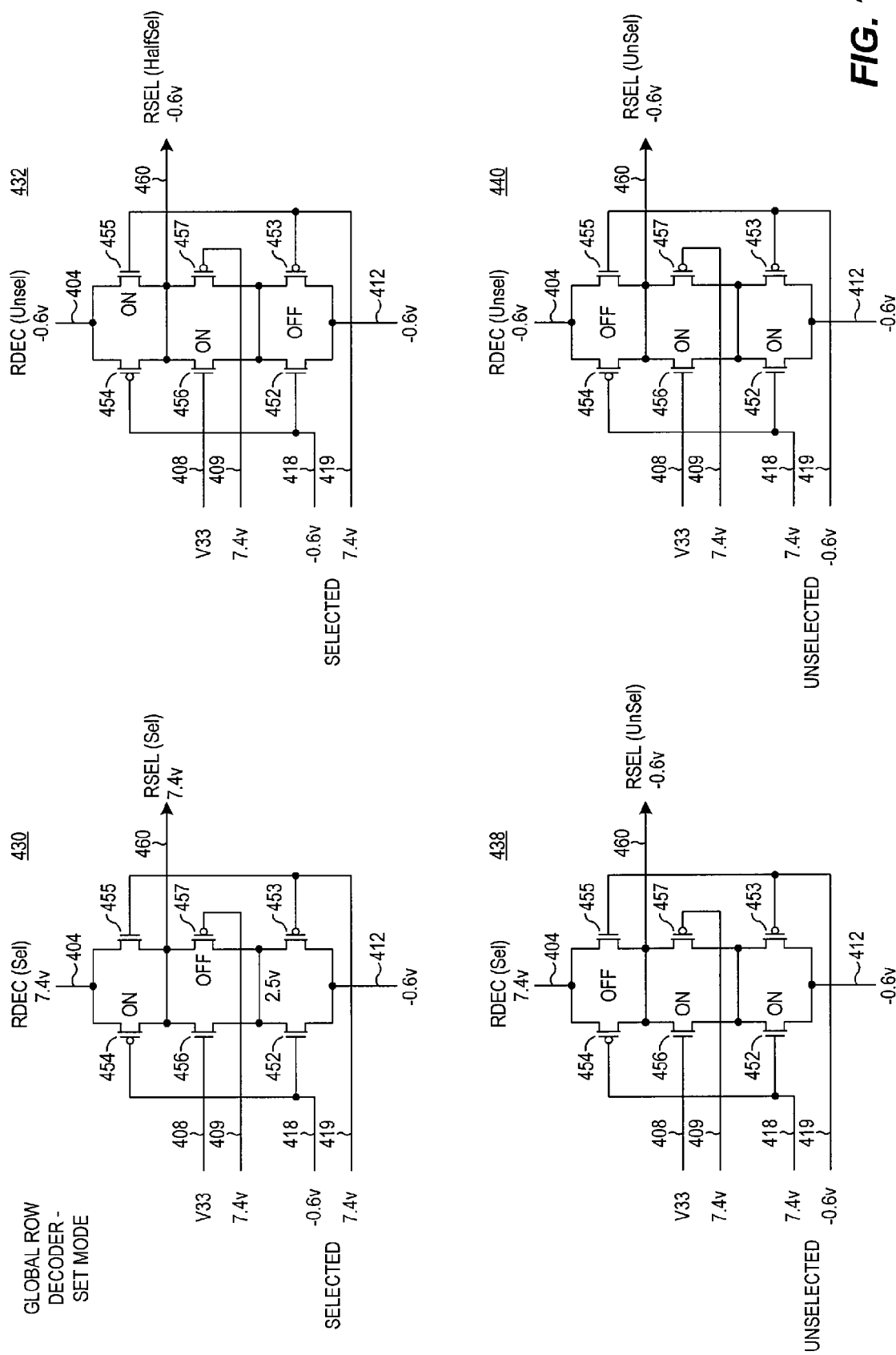
FIG. 12 is a schematic diagram of selected, half-selected, and unselected decoder output driver circuits as depicted in FIG. 11, showing exemplary bias conditions for a set mode of operation.
Figure 13:
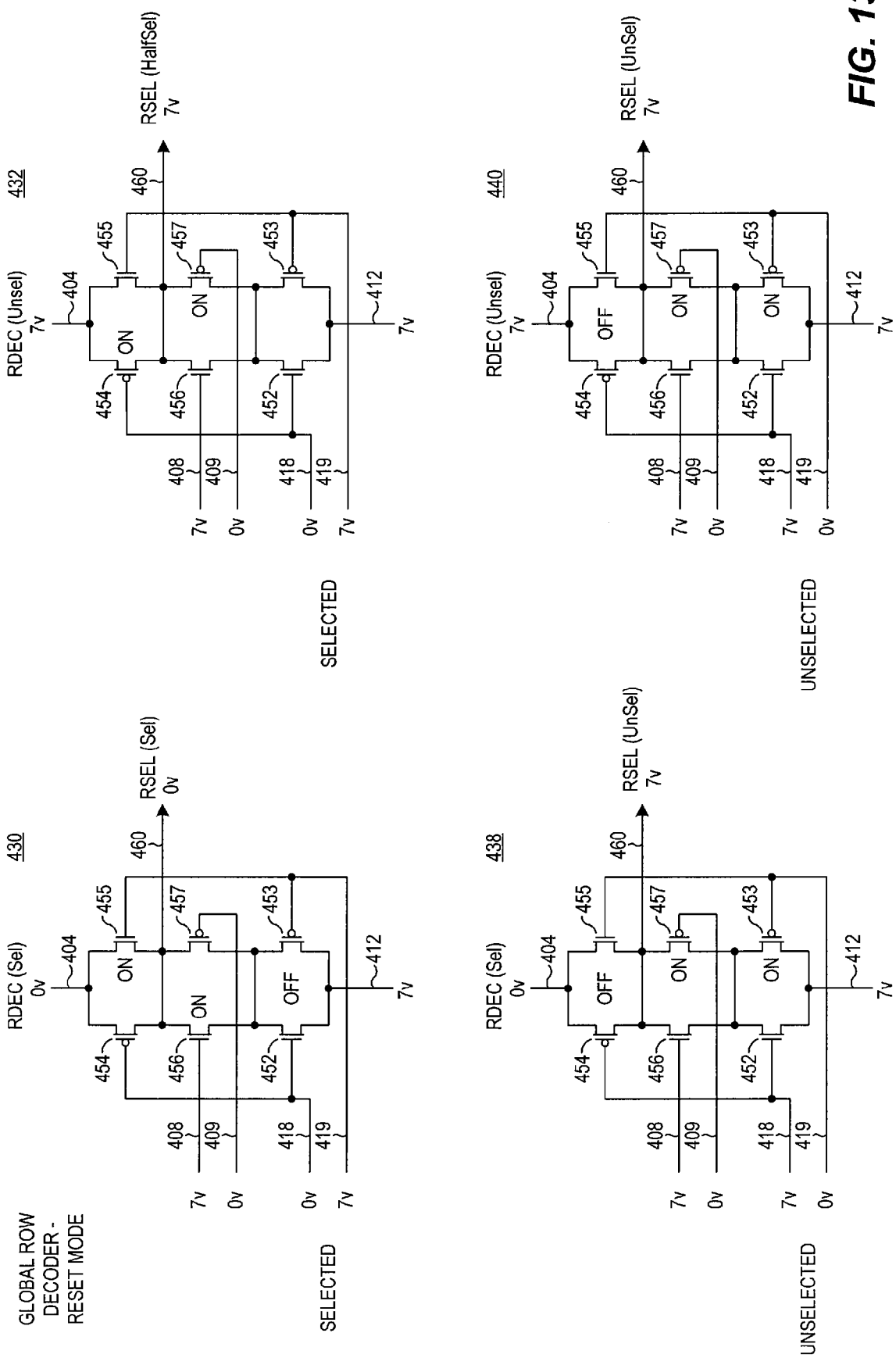
FIG. 13 is a schematic diagram of selected, half-selected, and unselected decoder output driver circuits as depicted in FIG. 11, showing exemplary bias conditions for a reset mode of operation.

While the operation of this driver circuit 451 is fully disclosed by the circuitry and biasing conditions shown in this figure, it may be easier to fully appreciate the precise operation in light of the next two figures. FIG. 12 depicts, for the set mode of operation, four separate decoder output driver circuits 430, 432, 438, and 440 (as shown in FIG. 10), which respectively correspond to a selected RSEL output, a half-selected RSEL output, an unselected RSEL output for a decoder output driver circuit receiving a selected RDEC line, and an unselected RSEL output for a decoder output driver circuit receiving an unselected RDEC line. FIG. 13 depicts the same four decoder output driver circuits 430, 432, 438, and 440 for the reset mode of operation.

Figure 14:
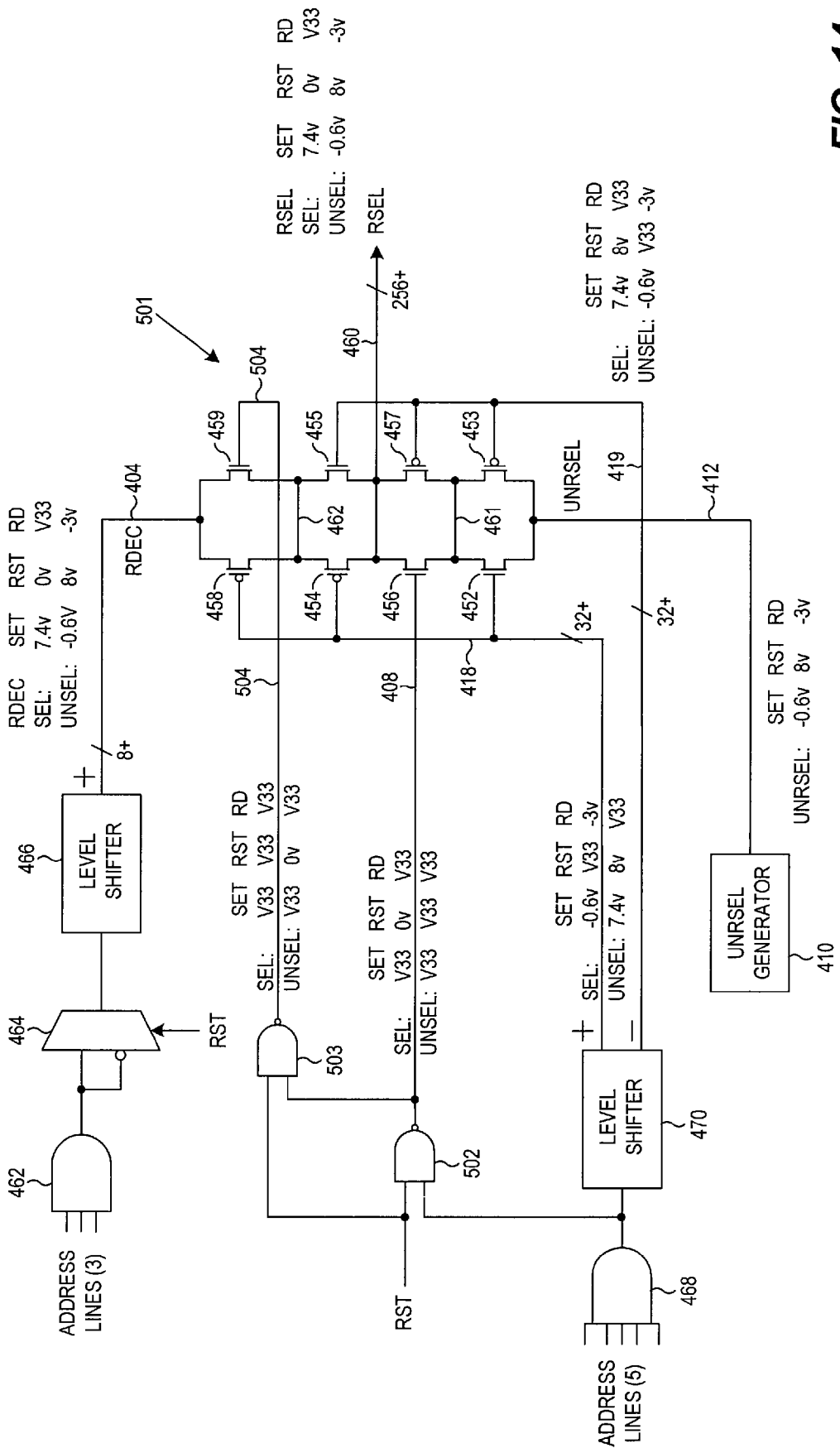
FIG. 14 is a block/schematic diagram of a dual polarity row decoder including another embodiment of a decoder output driver circuit in accordance with an embodiment of the present invention, and showing exemplary bias conditions for several modes of operation.

Referring now to FIG. 14, a block/schematic diagram of a dual polarity row decoder 500 includes a decoder output driver circuit 501 in accordance with certain embodiments of the present invention. This decoder output driver circuit 501 may be viewed as a "both sides" protection driver circuit. The figure also shows exemplary bias conditions for the various major nodes, for the set, reset, and read modes of operation. While certain differences are described below, this decoder circuit 500 is nonetheless generally consistent with that shown in the block diagram of FIG. 10. The rationale for such a "both sides" protection circuit is highlighted by showing a greater magnitude reset voltage of 8 v, rather than the 7 v magnitude shown in FIG. 11.

Relative to the circuit topology shown in FIG. 11, this decoder output driver circuit 501 includes a fourth coupling circuit (transistors 458, 459) disposed between the RDEC node 404 and the first coupling circuit (transistors 454, 455) (i.e., coupling the RDEC node 404 to an intermediate node 462). The level shifter circuit employed in FIG. 11 is replaced here by logic gates 502, 503, which may be powered by V33 and ground, and which generate bias signals 408 and 504. Each of the nodes 408, 504 is either biased at V33 or ground, for both the set and reset modes of operation.

The RDEC line and the UNRSEL line coupled to a given decoder output driver circuit 501 may be viewed as before, and each is biased to the same voltage (for a given mode of operation) as depicted in FIG. 11. Each of the first, second, and third coupling circuits may be generally viewed in a functional sense as before, although the voltage levels on nodes 408, 504, 418, and 419 are somewhat different than the analogous signals depicted in FIG. 11, and the specific operation of this circuit is different in its details. The fourth coupling circuit may be viewed as limiting the voltage across the first coupling circuit when the RSEL output is unselected in the reset mode of operation, and for coupling the RSEL output when selected in the set mode of operation to the RDEC node. Here, these signals 408, 504, 418, and 419 combine a switching function with a protect function (which is also the reason why the output signal of the predecoder 468 serves as an input to NAND gate 502). For example, node 419 is coupled to the gates of transistors 453 and 457, yet is also coupled to the gate of transistor 459. When transistors 453 and 457 are turned on, they serve in a switching role to drive the RSEL output to the UNRSEL node. Yet, when transistor 459 is turned on, it serves to protect the first coupling circuit from exposure to a high voltage on the RSEL output.

During the set mode of operation, the V33 protect voltage is conveyed on node 408 to the gate of transistor 456, which serves, as before, to protect the lower-most coupling circuit from a large breakdown voltage that would otherwise appear across such coupling circuit. (See FIG. 15, driver 430, to illustrate this condition in more detail.) The power supply voltage V33 functions as a convenient intermediate voltage relative to the RSEL voltage (e.g., 7.4 v) and the UNRSEL voltage (e.g., –0.6 v).

During the reset mode of operation, the V33 protect voltage is conveyed on node 419 to the gates of PMOS transistors 453, 457. This voltage is still low enough to turn on transistors 453, 457 sufficiently to fully pass the reset high voltage (e.g., 8 volts conveyed on the UNRSEL line 412) to the unselected RSEL outputs. However, this V33 intermediate voltage is also coupled to the NMOS transistor 459 in the fourth coupling circuit. Consequently, the upper-most coupling circuit is now also protected from a reset voltage which exceeds the breakdown voltage. (See FIG. 13, driver 438, to illustrate this condition in greater detail.) Consequently, this circuit 501 may be viewed as a "both sides" protection decoder output driver circuit, since the lower-most coupling circuit is protected from breakdown for a high selected output that is greater than the breakdown voltage, and the upper-most coupling circuit is protected from breakdown for a high reset voltage that is greater than the breakdown voltage.

Figure 15:
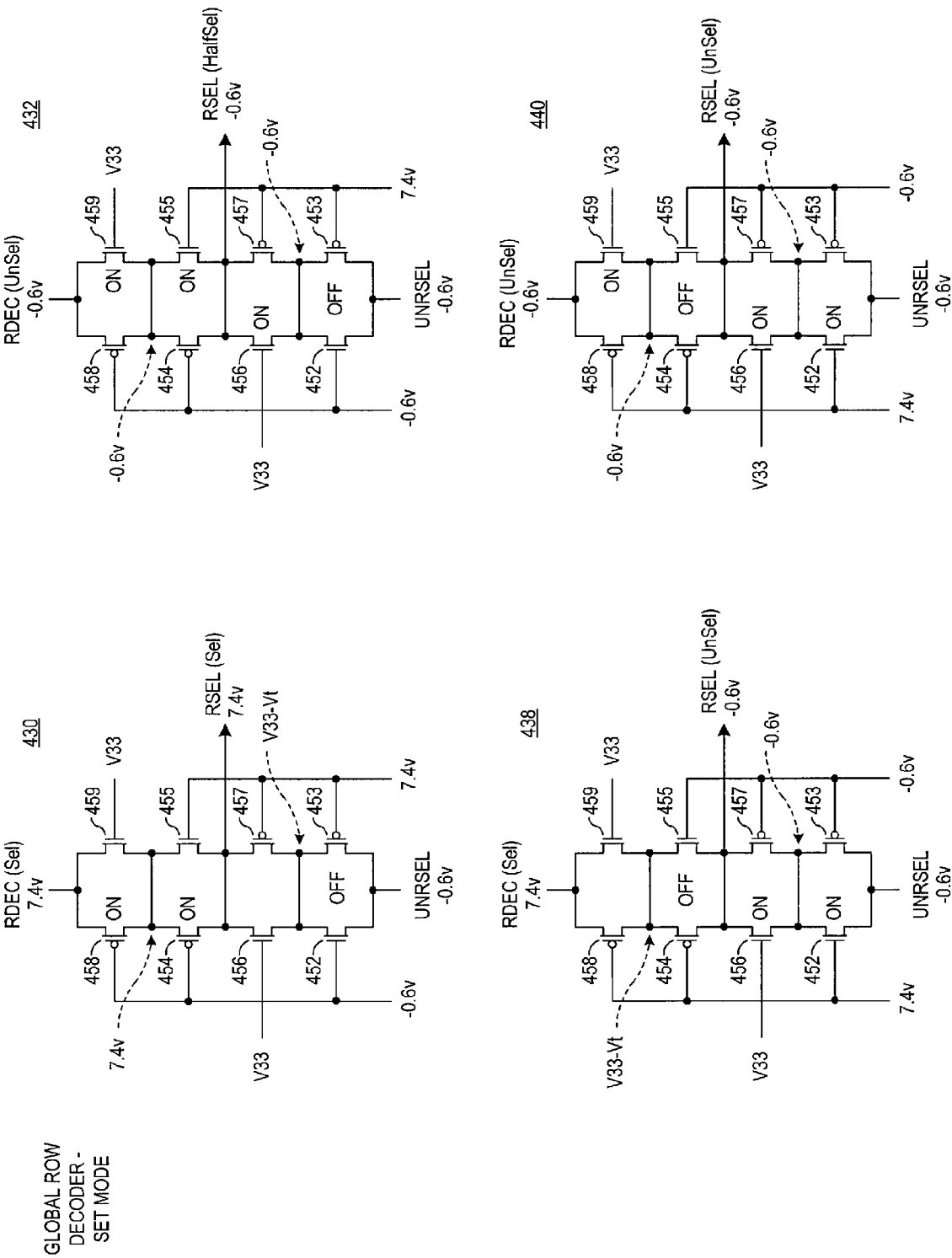
FIG. 15 is a schematic diagram of selected, half-selected, and unselected decoder output driver circuits as depicted in FIG. 14, showing exemplary bias conditions for a set mode of operation.
Figure 16:
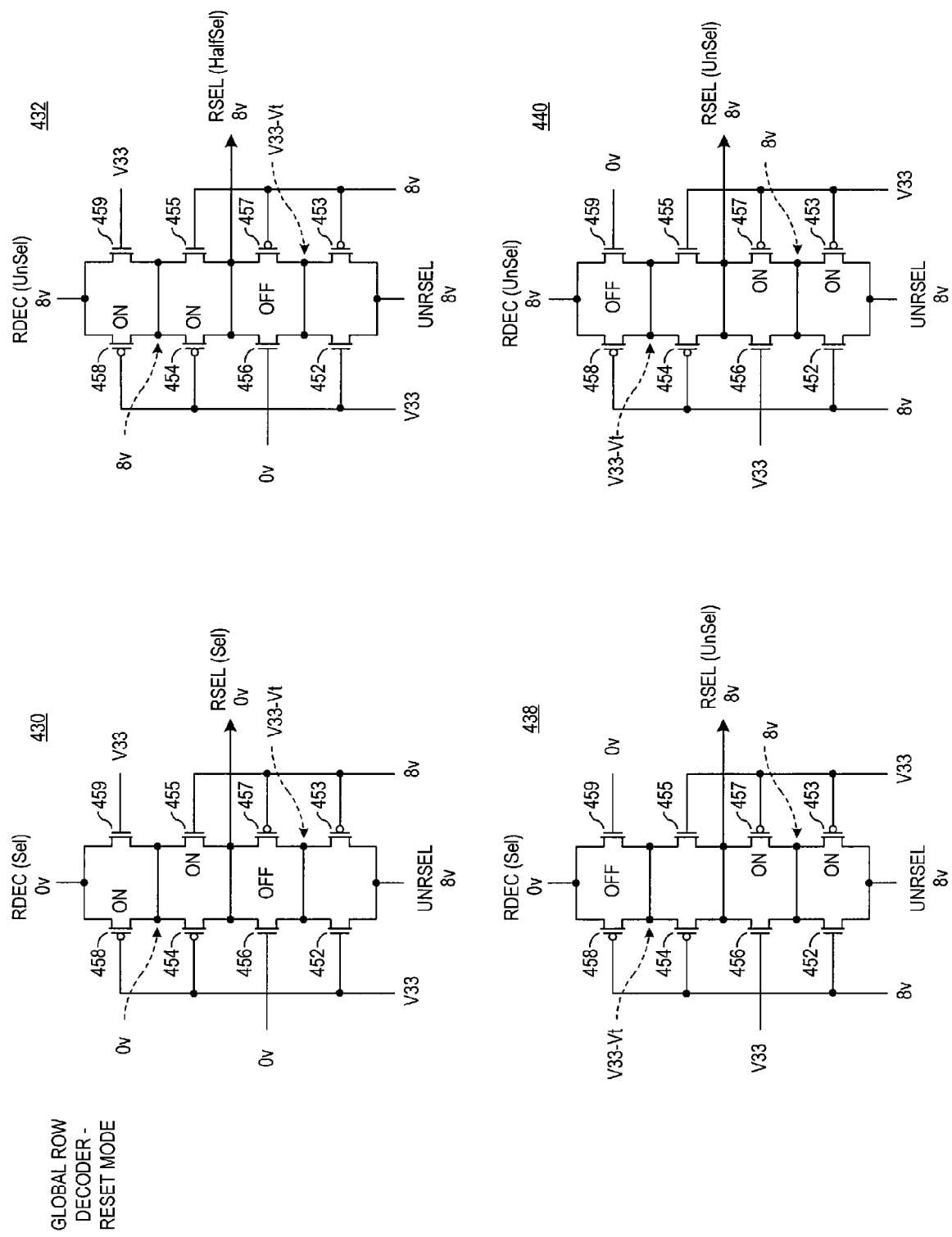
FIG. 16 is a schematic diagram of selected, half-selected, and unselected decoder output driver circuits as depicted in FIG. 14, showing exemplary bias conditions for a reset mode of operation.

While the operation of this driver circuit 501 is believed to be fully disclosed by the circuitry and biasing conditions shown in this figure, it may be easier to fully appreciate the precise operation of this circuit in light of the next two figures. FIG. 15 depicts, for the set mode of operation, four separate decoder output driver circuits 430, 432, 438, and 440 (as shown in FIG. 10), which respectively correspond to a selected RSEL output, a half-selected RSEL output, an unselected RSEL output for a decoder output driver circuit receiving a selected RDEC line, and an unselected RSEL output for a decoder output driver circuit receiving an unselected RDEC line. FIG. 16 depicts the same four decoder output driver circuits 430, 432, 438, and 440 for the reset mode of operation. In each figure, the bias voltages are indicated for all nodes, and the principle transistors driving an RSEL output either to the RDEC voltage, or to the UNRSEL voltage, are indicated as being "ON". From these figures, it may be appreciated that the voltage impressed across any transistor, for each of these 8 situations, is always well below the breakdown voltage.

Of specific mention in regards to FIG. 15 and FIG. 16, the two coupling circuits between the RDEC node and the RSEL output node function, on one hand, to limit the voltage across either of such coupling circuits when the respective voltage of the RDEC line and the RSEL line are different (e.g., see decoder circuit configuration 430 in both FIG. 15 and FIG. 16). In each such case, an intermediate voltage is provided to one of the two NMOS transistors within these two coupling circuits to bias the intermediate node 462 at a voltage preferably somewhat near the mid-point between the RDEC voltage and the RSEL voltage. This limits the voltage across each coupling circuit to a much lower value, preferably to a value less than the breakdown voltage of the devices within each coupling circuit (since the difference between the RDEC voltage and the RSEL voltage is contemplated to be greater than the breakdown voltage). Specifically, the intermediate voltage is coupled to the gate of the NMOS transistor closest to the RDEC and RSEL node having the higher voltage. These same two coupling circuits between the RDEC node and the RSEL output node function, on the other hand, to provide a path to drive the RSEL output node fully to the voltage of the RDEC line, irrespective of whether such a path is a pull-up path (e.g., in the set mode) or a pull-down path (e.g., in the reset mode).

Similarly, the two coupling circuits between the UNRSEL node and the RSEL output node function, on one hand, to limit the voltage across either of such coupling circuits when the respective voltage of the UNRSEL line and the RSEL line are different (e.g., see decoder circuit configuration 430 in both FIG. 15 and FIG. 16). In each such case, an intermediate voltage is provided to one of the two NMOS transistors within these two coupling circuits to bias the intermediate node 461 at a voltage preferably somewhat near the mid-point between the UNRSEL voltage and the RSEL voltage. This limits the voltage across each coupling circuit to a much lower value, preferably to a value less than the breakdown voltage of the devices within each coupling circuit. Specifically, the intermediate voltage is coupled to the gate of the NMOS transistor closest to the UNRSEL and RSEL node having the higher voltage. These same two coupling circuits between the UNRSEL node and the RSEL output node function, on the other hand, to provide a path to drive the RSEL output node fully to the voltage of the UNRSEL line, irrespective of whether such a path is a pull-up path (e.g., in the reset mode) or a pull-down path (e.g., in the set mode).

It should be noted that other modes of operation may be provided by the decoders described herein. For example, a standby mode, and one or more test modes may be provided by arranging for appropriate voltages on each of the decoder output driver circuit nodes shown in these figures. However, such additional modes of operation typically do not require high voltages as do the set and reset modes, and are therefore not described herein.

Figure 17:
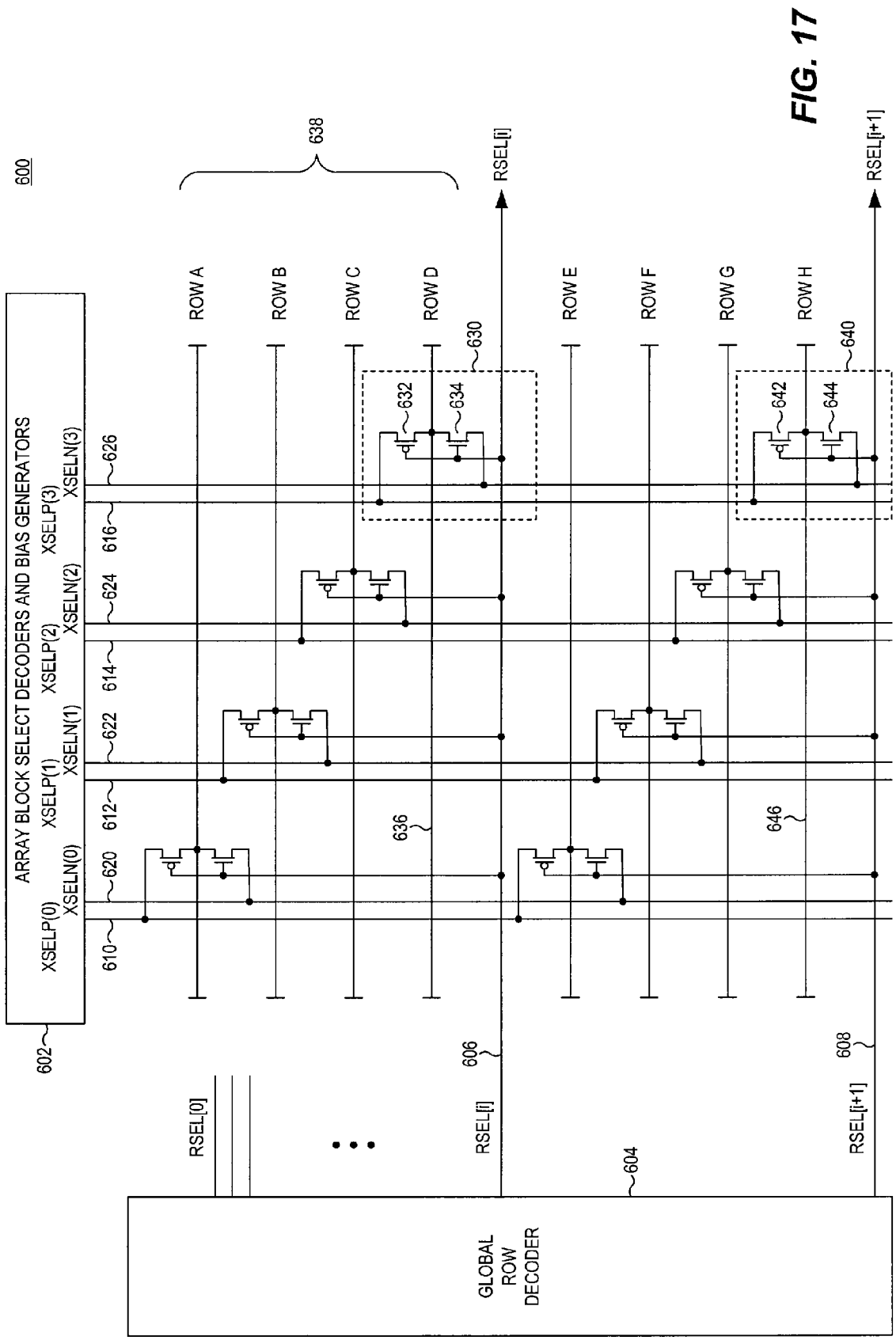
FIG. 17 is a block/schematic diagram depicting a global row decoder arrangement with multi-headed word line drivers, each coupled to respective lines of a source selection bus and a reverse source selection bus.

Referring now to FIG. 17, a block diagram is depicted of a useful multi-headed word line decoder configuration 600. The XSELP and XSELN lines traverse perpendicular to the word line segments, and the RSEL row select lines traverse parallel to the word line segments. A row decoder 604 generates a plurality of decoded RSEL lines, two of which are labeled 606 and 608. An array block select decoders and bias generators circuit 602 generates four decoded source selection busses XSELN respectively labeled 620, 622, 624, and 626, and four reverse source selection busses XSELP respectively labeled 610, 612, 614, and 616.

A quad (i.e., four-headed) word line driver circuit 638 includes four separate word line driver circuits 630, each coupling a respective word line (e.g., word line 636) to either an associated XSELN line (e.g., in a set mode when the RSEL 606 is selected) or to an associated XSELP line (in a set mode when the RSEL 606 is unselected). As described above, one selected XSELN may convey a selected bias level, and the other XSELN lines convey an unselected bias level, in the set mode of operation.

Similarly, a second quad word line driver circuit is shown which includes four separate word line driver circuits 640, each coupling a respective word line (e.g., word line 646) to either an associated XSELN line or to an associated XSELP line. Similar decoding structures and array organizations are disclosed in the aforementioned U.S. Pat. No. 6,879,505 to Roy E. Scheuerlein, particularly in relation to FIG. 9 thereof.

Figure 18:
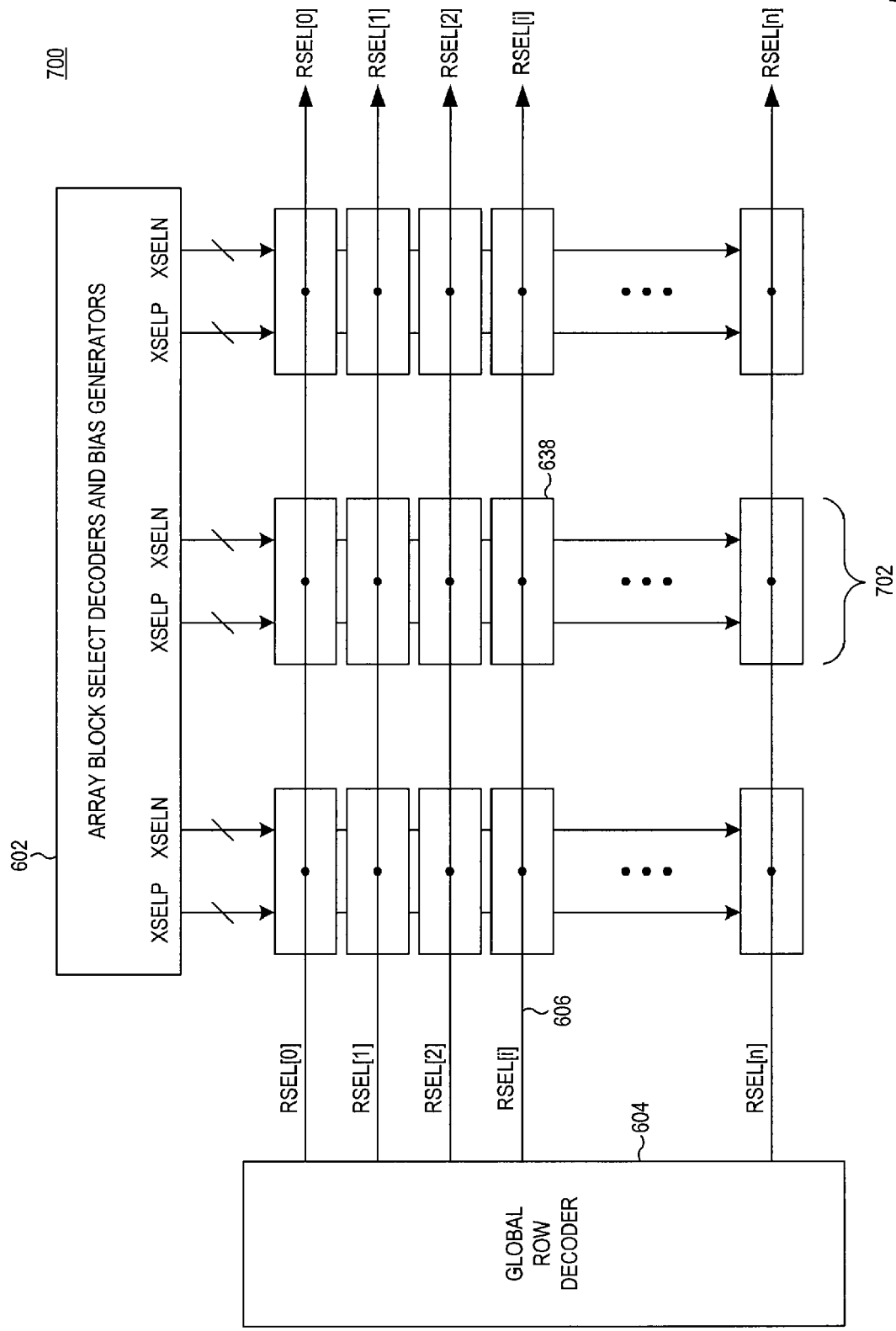
FIG. 18 is a block diagram depicting a global row decoder arrangement in which row select lines drive multi-headed word line drivers for each of a plurality of array blocks.

Referring now to FIG. 18, a block diagram is shown representing a multi-headed word line decoder 700 having multiple four-headed driver circuits, such as that depicted in FIG. 17, spaced across at least a portion of the memory array. The global row decoder 604 generates a plurality of decoded row select (RSEL) lines, labeled RSEL[0], RSEL[1], . . . RSEL[n], one of which (e.g., RSEL[i]) is labeled 606, as before. The array block select decoders and bias generators circuit 602 generates four decoded source selection busses XSELN and four reverse source selection busses XSELP for each vertical group 702 of multi-headed word line driver circuits. Each multi-headed word line driver circuit (e.g., 638) is responsive to a respective one of the RSEL lines generated by the global row decoder 604. Similar decoding structures and array organizations are disclosed in the aforementioned U.S. Pat. No. 6,879,505 to Roy E. Scheuerlein, particularly in relation to FIG. 10 thereof.

Figure 19:
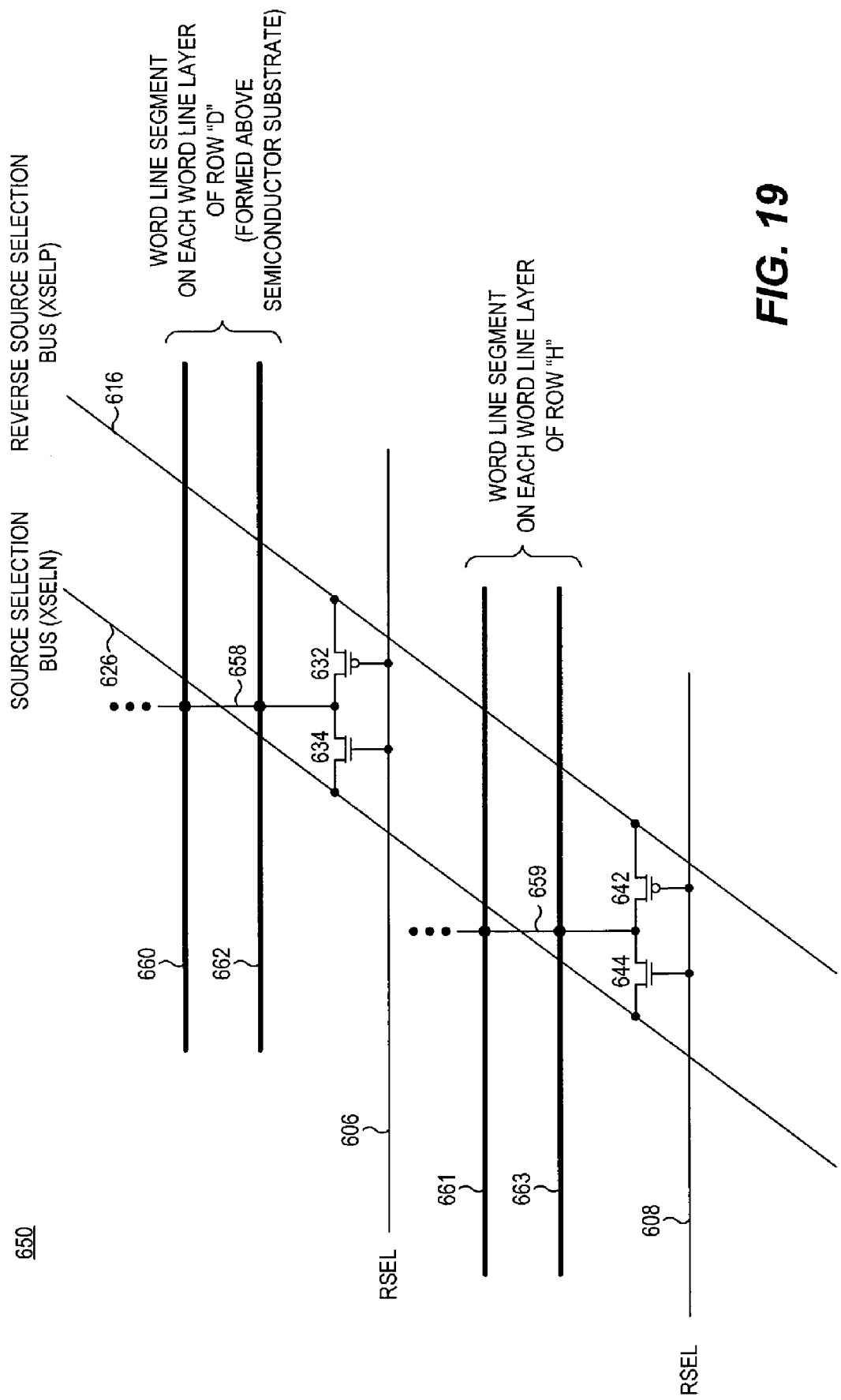
FIG. 19 is a three-dimensional view depicting a portion of a three-dimensional memory array, consistent with certain embodiments of that illustrated in FIG. 17 and FIG. 18, and illustrating a word line driver circuit coupled by way of a vertical connection to a respective word line segment in each of two adjacent array blocks, and on each of two or more word line layers.

Referring now to FIG. 19, a schematic diagram is shown representing a useful three-dimensional memory array having a segmented word line arrangement. Each word line is formed by one or more word line segments on at least one, and advantageously more than one, word line layer of the memory array. For example, a first word line is formed by word line segment 660 disposed on one word line layer of the memory array and by word line segment 662 disposed on another word line layer. The word line segments 660, 662 are connected by a vertical connection 658 to form the first word line. The vertical connection 658 also provides a connection path to the word line driver devices 630, 632 typically disposed in another layer (e.g., within the semiconductor substrate). A RSEL output 606 from a global row decoder (not shown) at times couples the word line segments 660, 662 through device 634 to a decoded source selection bus line XSELN 626, and at other times couples the word line segments 660, 662 through device 632 to a decoded reverse source selection bus line XSELP 616, as shown in FIG. 17.

Also shown are word line segments 661, 663 which are connected by a vertical connection 659 to form a second word line and to provide a connection path to the word line driver circuit 642, 644, which is coupled to a second RSEL output 608. While this figure describes an exemplary array configuration, many embodiments are contemplated for use with the decoder circuits described herein.

In certain preferred embodiments, a six-headed word line driver is utilized. The six word lines associated with such a six-headed word line driver circuit are common to two adjacent memory blocks, as described in the aforementioned U.S. Pat. No. 7,054,219. In other words, a given six-headed word line driver decodes and drives six word lines in each of two adjacent blocks. As implied by the figure, these adjacent blocks may be viewed as being respectively to the left and to the right of the associated word line drivers. However, in preferred embodiments such multi-headed word line drivers are disposed substantially beneath the array blocks, and only the vertical connections to the word lines made between the blocks.

Certain embodiments are contemplated having non-mirrored arrays (e.g., a word line layer associated with only a single bit line layer), such as is described in U.S. application Ser. No. 11/095,907 filed Mar. 31, 2005, by Luca G. Fasoli, et al., entitled "Method and Apparatus for Incorporating Block Redundancy in a Memory Array" (now U.S. Pat. No. 7,142, 471), the disclosure of which is hereby incorporated by reference in its entirety. In particular, FIG. 15 shows 4 bit line layers, a 16-headed column decoder on both the top and the bottom sides of an array block. This figure shows 4 bit lines on each of 4 bit line layers being coupled by a single 16-headed column decoder to the top data bus (describing 4 I/O layers), and likewise 4 bit lines on each of the same 4 bit line layers being coupled by a single 16-headed column decoder to the bottom data bus (although in that description, the two groups of 16 selected bit lines were located within the same array block). Other half-mirrored embodiments are contemplated, such as those sharing a word line layer with two bit line layers, to form two memory planes.

Figure 20:
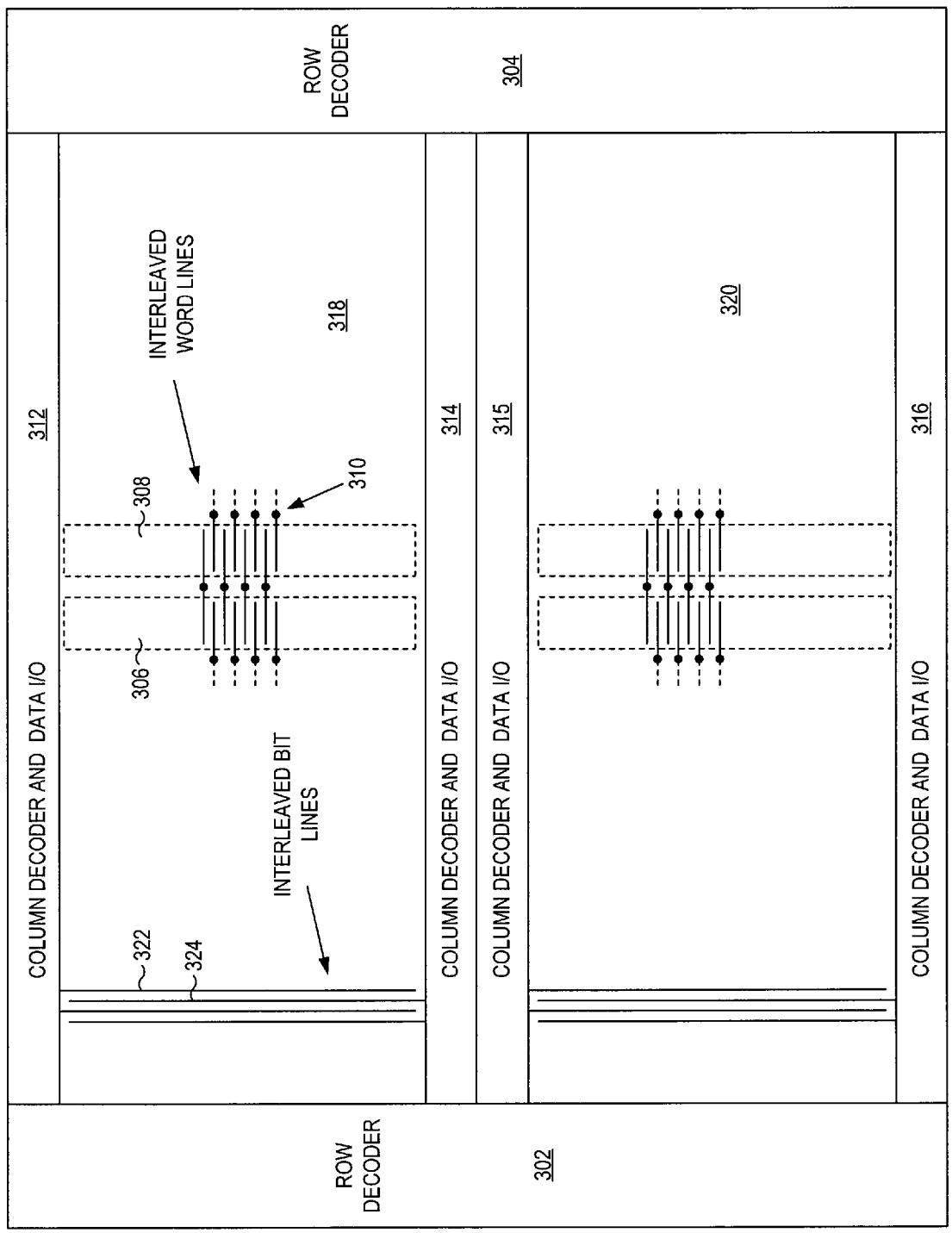
FIG. 20 is a block diagram depicting an exemplary integrated circuit including a three-dimensional memory array, and which integrated circuit includes a global row decoder on one side of the array, and a pair of column decoders on both top and bottom of the array.

FIG. 20 is a block diagram of an exemplary memory array 300. Dual row decoders 302, 304 generate row select lines for the array, which each traverse across the array 300. In this embodiment, the word line driver circuits (not shown) are spatially distributed beneath the memory array and make connection to the word lines by way of vertical connections (one of which is labeled 310) on alternating sides of individual memory array blocks (two which are labeled 306, 308). The memory array shown includes two memory "stripes" 318, 320, and further includes four column decoder and bit line circuit blocks 312, 314, 315, 316 respectively at the top, upper middle, lower middle, and bottom of the array. Additional stripes may also be incorporated, and each stripe may include one or more memory bays. The bit lines within each block are also preferably 2:1 interleaved to relax the pitch requirements of the column related circuitry. As an example, bit line 322 is associated with (i.e., driven and sensed by) the upper column circuit block 312, while bit line 324 is associated with the bottom column circuits block 314.

In exemplary embodiments, the memory array 300 is a three-dimensional memory array of passive element memory cells formed on each of four memory planes. Such memory cells preferably incorporate a trimmable resistor element, as described herein, and may also include an antifuse. Each logical word line is connected to a word line segment on each of four word line layers (each associated with a respective memory plane).

Each stripe of the memory array 300 is divided into a large number of blocks, such as block 308. In a selected memory array block, one of these source selection bus lines XSELN (or reverse source selection bus XSELP) is decoded and driven to an active bias condition by a row bias circuit, and remaining bus lines (also called "bias lines") are driven to an inactive condition (i.e., a voltage suitable for an unselected word line). Consequently, a single selected RSEL line preferably drives one word line active in the selected memory block, and drives the other N−1 word lines in the selected block to an unselected bias level. In other non-selected memory blocks, none of the individual bus lines of the source and reverse source selection busses are driven active, so that no word lines are selected by the active RSEL line. Alternatively, the source and reverse source selection busses in unselected array blocks may be left floating, particularly in the forward mode.

Each row select line traverses across all the memory blocks in the entire memory stripe, and drives a respective four-headed word line driver located "between" each pair of blocks of the stripe (as well as two more, each respectively located "outside" the first and last blocks). The RSEL lines may also be known as "global row lines", and may also correspond to the row decoder output nodes referred to herein. Additional details of exemplary circuits, operation, bias conditions, float conditions, modes of operation including read and program modes, and the like, are further described in the aforementioned U.S. Pat. No. 6,879,505, and additionally described in U.S. Pat. No. 7,054,219 to Christopher J. Petti, et al., entitled "Transistor Layout Configuration for Tight-Pitched Memory Array Lines", the disclosure of which is hereby incorporated by reference in its entirety, and further in U.S. application Ser. No. 11/146,952 filed on Jun. 7, 2005 by Roy E. Scheuerlein, et al., entitled "Decoding Circuit for Non-Binary Groups of Memory Line Drivers", the disclosure of which is hereby incorporated by reference in its entirety.

To speed up the selection time of a global row line, these RSEL lines may be driven at both ends thereof by two hierarchical row select decoders 520, 522 (also known as "global row decoders 520, 522"), each respectively located outside the array at left and right sides of the array stripe. By using a hierarchical decoder structure the size of the global row decoder 520 is reduced, thus improving the array efficiency. In addition, a reverse decoding mode may be conveniently provided for improved testing capability, as further described in "Dual-Mode Decoder Circuit, Integrated Circuit Memory Array Incorporating Same, and Related Methods of Operation" by Kenneth K. So, et al., U.S. application Ser. No. 11/026,493 filed Dec. 30, 2004, the disclosure of which is hereby incorporated by reference in its entirety. Exemplary circuits for such hierarchical decoders may be found in "Apparatus and Method for Hierarchical Decoding of Dense Memory Arrays Using Multiple Levels of Multiple-Headed Decoders," by Luca G. Fasoli, et al., U.S. Patent Application Publication No. 2006-0146639 A1, the disclosure of which is hereby incorporated by reference in its entirety.

In certain textual materials incorporated by reference herein, an exemplary four-headed decoder circuit includes four "selected" bias lines and a single unselected bias line. The rationale for such a name is because a given decoder head couples its output to a "selected" bias line if the input to the decoder head is selected (i.e., driven to an active level). However, by no means does this imply that all four of the heads shown drive their respective outputs to a level that is reflective of the output being selected, because typically only one of the selected bias lines is actually biased in a condition suitable for a selected output, and the remaining three selected bias lines are biased in a condition suitable for an unselected output. These "selected" bias for a multi-headed decoder are described herein as a "source selection bus," but operate similarly, except as noted. Some embodiments also include a second such bus, being a "reverse source selection bus" rather than a single unselected bias line.

Conversely, if the input node for the multi-headed decoder is inactive or unselected, then all such heads drive their respective outputs to an associated "unselected" bias line (or respective bus line of a reverse source selection bus). For many useful embodiments, such unselected bias lines may be combined into a single bias line shared by all heads of the multi-headed decoder.

Similar or related word line decoder structures and techniques, including additional hierarchical levels of such decoding, bias circuit organization for the decoded busses (e.g., XSELN and XSELP), and related supporting circuits, are further described in U.S. Pat. No. 6,856,572 by Roy E. Scheuerlein and Matthew P. Crowley, entitled "Multi-Headed Decoder Structure Utilizing Memory Array Line Driver with Dual Purpose Driver Device"; the disclosure of which is hereby incorporated by reference in its entirety, and in U.S. Pat. No. 6,859,410 by Roy E. Scheuerlein and Matthew P. Crowley, entitled "Tree Decoder Structure Particularly Well-Suited to Interfacing Array Lines Having Extremely Small Layout Pitch", the disclosure of which is hereby incorporated by reference in its entirety.

Figure 21:
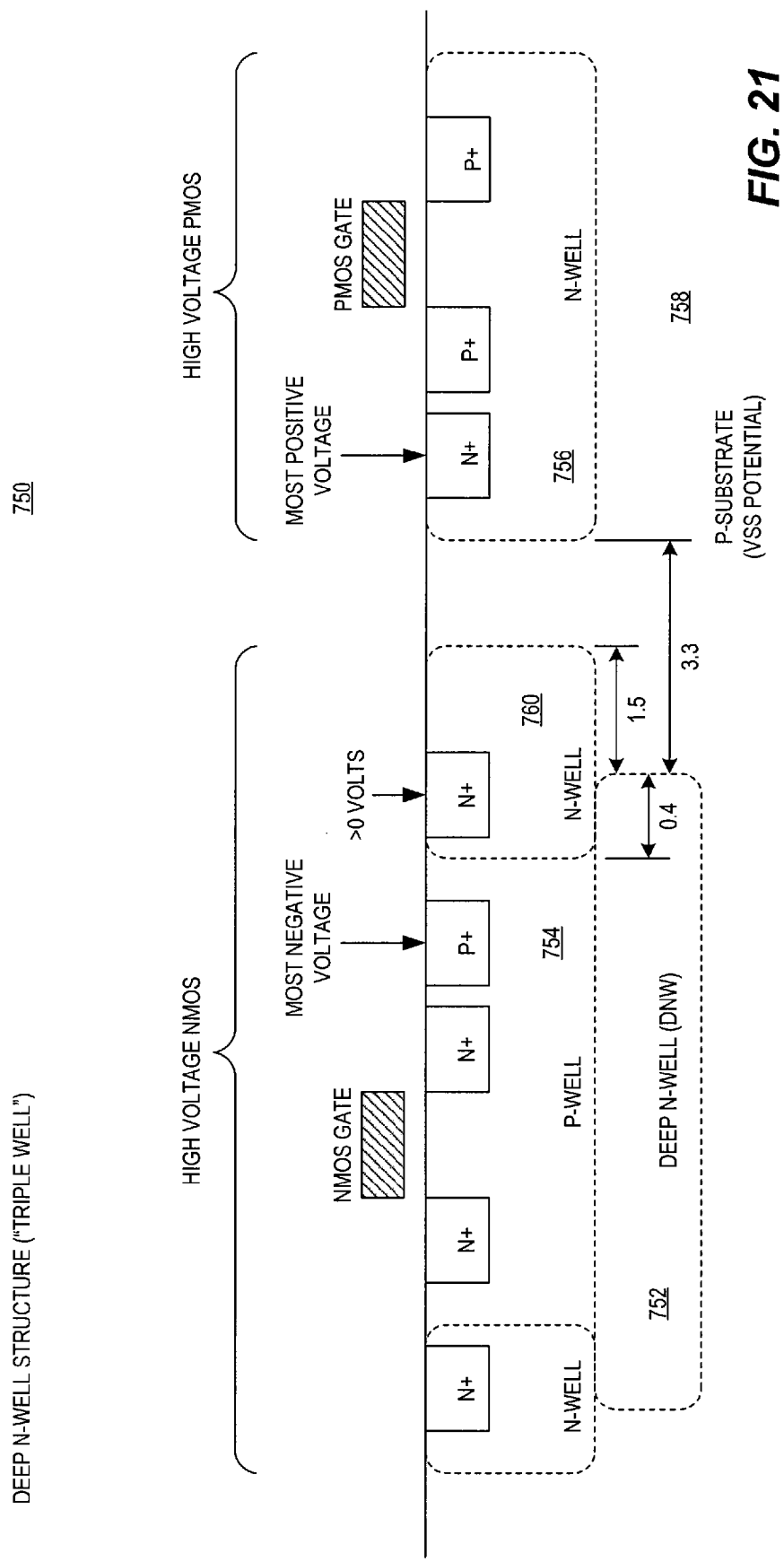
FIG. 21 is a cross-section diagram of a triple well structure incorporating a deep n-well semiconductor structure useful for implementation of certain embodiments of the present invention.

Referring now to FIG. 21, a triple well structure is depicted, which is utilized to provide for certain source/drain nodes to be able to be driven above and below the potential of the bulk substrate (e.g., VSS) which is necessary to achieve the dual polarity decoder outputs. The PMOS devices (e.g., a representative one shown on the right side of the figure) are formed in a traditional N-well 756. The NMOS devices (e.g., a representative one shown on the left side of the figure) are enclosed in a triple well structure where an intermediate depth P-well 754 is surrounded by a deep N-well 752. All the N-wells 756 for the PMOS devices share the most positive voltage in each mode of operation, and all the P-wells 754 for the NMOS devices share the most negative voltage in each mode of operation.

Figure 22:
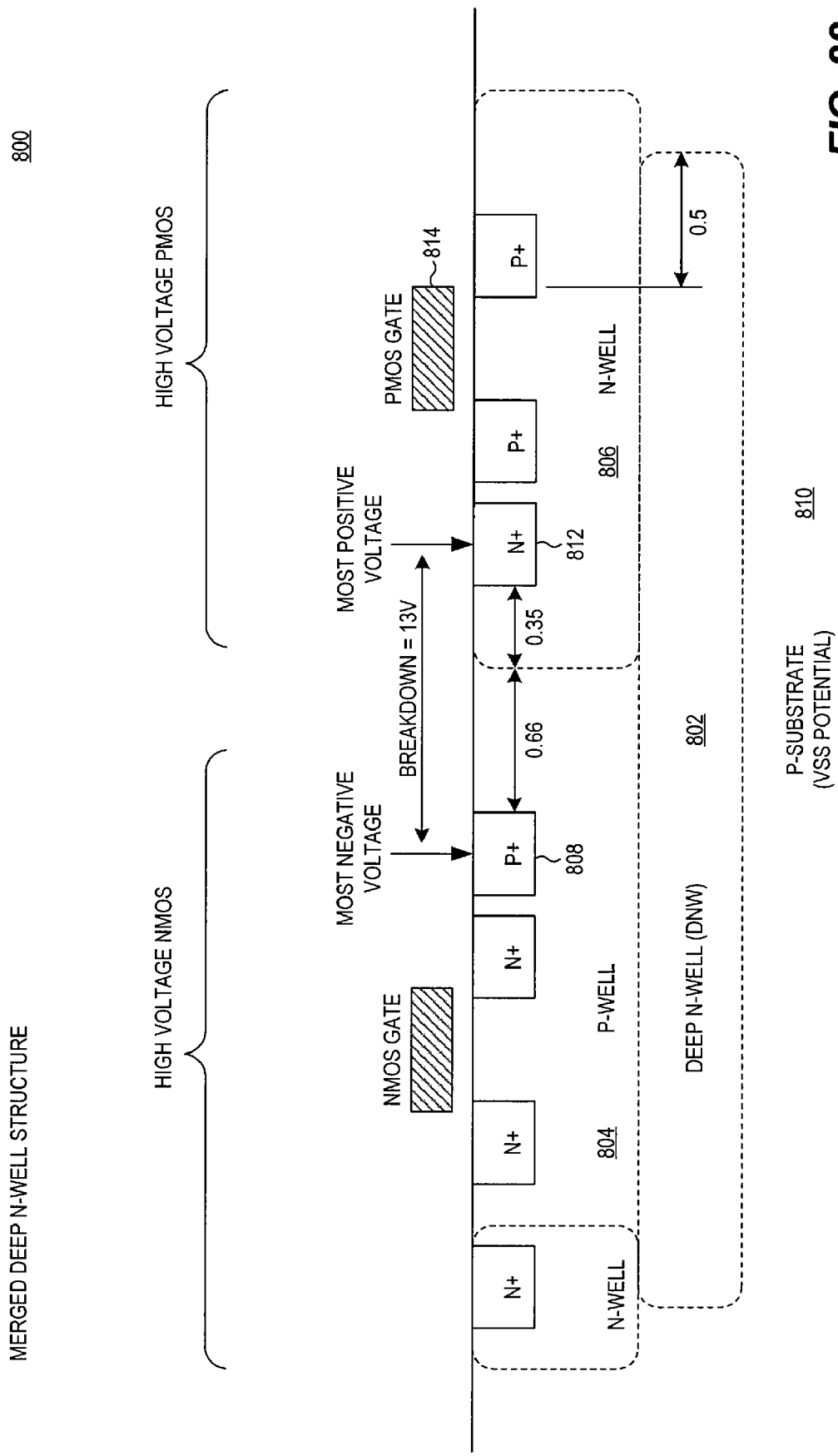
FIG. 22 is a cross-section diagram of a triple well structure incorporating a merged deep n-well semiconductor structure useful for implementation of certain embodiments of the present invention.

Referring now to FIG. 22, an improved triple well structure is depicted. The PMOS devices are enclosed in a deep N-Well 802. The NMOS devices are in a triple well structure where an intermediate depth P-Well 804 is enclosed by the same deep N-Well 802 used for the PMOS devices. Layout of the transfer gates is compacted by merging the PMOS deep N-Well and the NMOS triple well deep N-Well. This is possible because the source and drain voltages of the transfer gate circuit NMOS and PMOS transistors are common voltages (i.e., the NMOS and PMOS transistors of each coupling circuit in the decoder output driver circuit are connected in parallel).

As before, all the N-wells 806 for the PMOS devices share the most positive voltage in each mode of operation (being coupled to N+ region 812), and all the P-wells 804 for the NMOS devices share the most negative voltage in each mode of operation (being coupled to P+ region 808). In addition, the entire decoder output driver circuit can use a common deep N-Well 802 at the N-well 806 bias voltage. This merged structure avoids having any deep N-well 752 to N-well 756 spacing limitations (as indicated in FIG. 21).

It should be understood that in certain embodiments the memory array may be formed "above" the substrate, and various circuit blocks being "below" the memory array. As used herein, being "above" or "below" the substrate or a memory array block, which are actual physical structures having generally a planar character, is relative to a direction normal to the surface of such a substrate or memory plane.

When using reset programming, each memory cell is set back to a low resistance state by the "set" mode of operation, which may be used to rewrite new data, or erase a group of bits, by applying forward bias to one bit at a time, or many bits in a page of data or an erase block. High performance erase may be achieved by selecting multiple bit lines and or multiple word lines in a block, and setting the cells to low resistance. Current limiting circuitry in the bit line driver path limits the total current flowing to the common word line. Depending upon the memory cell technology chosen, and the relative magnitude of the set current and reset current, and the magnitude of U cell leakage current, fewer blocks may be selected for the set or erase operation than for reset (i.e., programming).

One choice of resistive material is the polysilicon material that forms the diode. An antifuse ("AF") can be in series with the polysilicon diode, and the antifuse is popped before the programming event in a formatting step in manufacturing. The antifuse serves to limit the maximum current that the cell will conduct when set.

As regards various embodiments described above, many types of memory cells are capable of being programmed using a reverse bias (e.g., the reset mode described above). Such cells include a passive element cell having a metal oxide (e.g., a transition metal oxide) and a diode. Other suitable cells include those having a resistive material being programmed between a low R state and a high R state with a diode select element. Examples include a programmable metallization connection, a phase change resistor such as GST material, an organic material variable resistor, a complex metal oxide, a carbon polymer film, a carbon nanotube resistor, a doped chalcogenide glass, and a Schottky barrier diode containing mobile atoms to change resistance. The resistive material chosen may provide one-time-programmable (OTP) memory cells, or write-many memory cells. In addition, a polysilicon diode could be employed having conduction modified by reverse bias stress.

Descriptions of useful two-terminal memory cells are provided in the following papers which are hereby incorporated herein by reference: (i) Pirovano et al., "Electronic Switching in Phase-Change Memories," IEEE Transactions on Electronic Devices, Vol. 51, No. 3, Mar. 2003; (ii) Baek et al., "Multi-layer Cross-point Binary Oxide Resistive Memory (OxRRAM) for Post-NAND Storage Application," IEEE International Electron Devices Meeting, 2005; (iii) Baek et al., "Highly Scalable Non-volatile Resistive Memory using Simple Binary Oxide Driven by Asymmetric Unipolar Voltage Pulses," IEEE International Electron Devices Meeting, 2004; and (iv) Hwang et al., "Writing Current Reduction for High-Density Phase-Change RAM," IEEE International Electron Devices Meeting, 2003. Additional details are also provided in U.S. Pat. No. 6,891,748, which is hereby incorporated herein by reference.

Useful memory cells for reverse reset operation are described in U.S. Pat. No. 6,952,030 entitled "High-Density Three-Dimensional Memory Cell" to S. Brad Herner, et al.; and also in U.S. application Ser. No. 11/237,167 entitled "Method for Using a Memory Cell Comprising Switchable Semiconductor Memory Element with Trimmable Resistance" by Tanmay Kumar, et al., filed on Sep. 28, 2005. A suitable metal oxide memory cell is shown in U.S. application Ser. No. 11/394,903 filed on Mar. 31, 2006, entitled "Multi-level Nonvolatile Memory Cell Comprising a Resistivity-Switching Oxide or Nitride and an Antifuse" by S. Brad Herner. A suitable memory cell using a phase change material, which can provide multiple resistance states, is shown in U.S. Patent Application Publication No. 2005-0158950 entitled "Non-Volatile Memory Cell Comprising a Dielectric Layer and a Phase Change Material in Series" by Roy E. Scheuerlein, et al. Each of these above-referenced disclosures is incorporated herein by reference in its entirety. Other exemplary memory cells having a transition-metal oxide (e.g., including those having cobalt), and exemplary cells in which the polysilicon material of the steering element itself comprises the switchable resistance material, are described in the MA-163-1 application referenced below.

In addition, U.S. application Ser. No. 11/125,939 filed on May 9, 2005, entitled "Rewritable Memory Cell Comprising a Diode and a Resistance Switching Material" by S. Brad Herner, et al., discloses a useful rewritable memory cell incorporating a diode in series with an oxide, such as a nickel oxide, in which the resistance of the memory cell may be repeatedly switched from low to high and from high to low resistance states. U.S. application Ser. No. 11/395,995 filed on Mar. 31, 2006, entitled "Nonvolatile Memory Cell Comprising a Diode and a Resistance Switching Material" by S. Brad Herner, et al., discloses a OTP multi-level memory cell which is set using forward bias and reset using reverse bias. Each of these above-referenced disclosures is incorporated herein by reference in its entirety.

In many of the embodiments described herein, the precise bias conditions imposed upon each respective bus line in the data path is independently controllable. The specific voltage and current settings for each of the set and reset drivers can be adjusted for each bit of the data path. As a result, certain memory cells having more than two states (i.e., "multi-level" memory cells) are contemplated for use with many of the structures described herein. Exemplary multi-level memory cells are described in U.S. application Ser. No. 11/237,167 filed on Sep. 28, 2005 entitled "Method for Using a Memory Cell Comprising Switchable Semiconductor Memory Element with Trimmable Resistance" by Tanmay Kumar, et al., the disclosure of which is incorporated herein by reference in its entirety, and in the MA-163-1 application, referenced below.

Exemplary passive element memory cells and related nonvolatile memory structures which may be useful in practicing the present invention are described the following documents, each of which is incorporated herein by reference in its entirety:

U.S. Pat. No. 6,034,882 entitled "Vertically Stacked Field Programmable Nonvolatile Memory and Method of Fabrication" to Mark G. Johnson, et al.;

U.S. Pat. No. 6,420,215 entitled "Three Dimensional Memory Array and Method of Fabrication" to N. Johan Knall, et al.;

U.S. Pat. No. 6,525,953 entitled "Vertically-Stacked, Field Programmable, Nonvolatile Memory and Method of Fabrication" to Mark Johnson, et al.;

U.S. Pat. No. 6,490,218 entitled "Digital Memory Method and System for Storing Multiple-Bit Digital Data" to Michael Vyvoda, et al.;

U.S. Pat. No. 6,952,043 entitled "Electrically Isolated Pillars in Active Devices" to Michael Vyvoda, et al.; and U.S. Patent Application Publication No. US2005-0052915 entitled "Nonvolatile Memory Cell Without a Dielectric Antifuse Having High- and Low-Impedance States" by S. Brad Herner, et al.

The following applications, each filed on Jul. 31, 2006, describe memory cell structures, circuits, systems, and methods that may be useful in practicing the present invention, each of which is incorporated herein by reference in its entirety:

U.S. application Ser. No. 11/496,985, now U.S. Patent Application Publication No. 2007-0069276, entitled "Multi-Use Memory Cell and Memory Array" by Roy Scheuerlein and Tanmay Kumar (the "10519-141" application);

U.S. application Ser. No. 11/496,984, now U.S. Patent Application Publication No. 2007-0070690, entitled "Method for Using a Multi-Use Memory Cell and Memory Array" by Roy Scheuerlein and Tanmay Kumar (the "10519-150" application);

U.S. application Ser. No. 11/496,874, entitled "Mixed-Use Memory Array" by Roy Scheuerlein (the "10519-142" application);

U.S. application Ser. No. 11/496,983 entitled "Method for Using a Mixed-Use Memory Array" by Roy Scheuerlein (the "10519-151" application);

U.S. application Ser. No. 11/496,870 entitled "Mixed-Use Memory Array With Different Data States" by Roy Scheuerlein and Christopher Petti (the "10519-149" application);

U.S. application Ser. No. 11/497,021 entitled "Method for Using a Mixed-Use Memory Array With Different Data States" by Roy Scheuerlein and Christopher Petti (the "10519-152" application);

U.S. application Ser. No. 11/461,393 entitled "Controlled Pulse Operations in Non-Volatile Memory" by Roy Scheuerlein (the "SAND-01114US0" application);

U.S. application Ser. No. 11/461,399 entitled "Systems for Controlled Pulse Operations in Non-Volatile Memory" by Roy Scheuerlein (the "SAND-01114US1" application);

U.S. application Ser. No. 11/461,410 entitled "High Bandwidth One-Time Field-Programmable Memory" by Roy Scheuerlein and Christopher J. Petti (the "SAND-0115US0" application);

U.S. application Ser. No. 11/461,419 entitled "Systems for High Bandwidth One-Time Field-Programmable Memory" by Roy Scheuerlein and Christopher J. Petti (the "SAND-01115US1" application);

U.S. application Ser. No. 11/461,424 entitled "Reverse Bias Trim Operations in Non-Volatile Memory" by Roy Scheuerlein and Tanmay Kumar (the "SAND-01117US0" application);

U.S. application Ser. No. 11/461,431 entitled "Systems for Reverse Bias Trim Operations in Non-Volatile Memory" by Roy Scheuerlein and Tanmay Kumar (the "SAND-01117US1" application);

U.S. application Ser. No. 11/496,986, now U.S. Patent Application Publication No. 2007-0072360, entitled "Method for Using a Memory Cell Comprising Switchable Semiconductor Memory Element with Trimmable Resistance" by Tanmay Kumar, S. Brad Herner, Roy E. Scheuerlein, and Christopher J. Petti (the "MA-163-1" application);

U.S. application Ser. No. 11/461,339 entitled "Passive Element Memory Array Incorporating Reversible Polarity Word Line and Bit Line Decoders" by Luca G. Fasoli, Christopher J. Petti, and Roy E. Scheuerlein (the "023-0048" application);

U.S. application Ser. No. 11/461,364 entitled "Method for Using a Passive Element Memory Array Incorporating Reversible Polarity Word Line and Bit Line Decoders" by Luca G. Fasoli, Christopher J. Petti, and Roy E. Scheuerlein (the "023-0054" application);

U.S. application Ser. No. 11/461,343 entitled "Apparatus for Reading a Multi-Level Passive Element Memory Cell Array" by Roy E. Scheuerlein, Tyler Thorp, and Luca G. Fasoli (the "023-0049" application);

U.S. application Ser. No. 11/461,367 entitled "Method for Reading a Multi-Level Passive Element Memory Cell Array" by Roy E. Scheuerlein, Tyler Thorp, and Luca G. Fasoli (the "023-0055" application);

U.S. application Ser. No. 11/461,352 entitled "Dual Data-Dependent Busses for Coupling Read/Write Circuits to a Memory Array" by Roy E. Scheuerlein and Luca G. Fasoli (the "023-0051" application);

U.S. application Ser. No. 11/461,369 entitled "Method for Using Dual Data-Dependent Busses for Coupling Read/Write Circuits to a Memory Array" by Roy E. Scheuerlein and Luca G. Fasoli (the "023-0056" application);

U.S. application Ser. No. 11/461,359 entitled "Memory Array Incorporating Two Data Busses for Memory Array Block Selection" by Roy E. Scheuerlein, Luca G. Fasoli, and Christopher J. Petti (the "023-0052" application);

U.S. application Ser. No. 11/461,372 entitled "Method for Using Two Data Busses for Memory Array Block Selection" by Roy E. Scheuerlein, Luca G. Fasoli, and Christopher J. Petti (the "023-0057" application);

U.S. application Ser. No. 11/461,362 entitled "Hierarchical Bit Line Bias Bus for Block Selectable Memory Array" by Roy E. Scheuerlein and Luca G. Fasoli (the "023-0053" application); and U.S. application Ser. No. 11/461,376 entitled "Method for Using a Hierarchical Bit Line Bias Bus for Block Selectable Memory Array" by Roy E. Scheuerlein and Luca G. Fasoli (the "023-0058" application).

As should be appreciated, specific exemplary embodiments shown herein have been described in the context of specific numeric examples, such as the number of decoded outputs, the number of decoder heads, the number of bus lines, the number of data busses, the number of array blocks within a memory bay, and the number of memory stripes. Other variations consistent with other design objectives may be implemented using the teachings of this disclosure. In the interest of clarity, not all of the routine features of the implementations described herein are shown and described.

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array.

As used herein, word lines (e.g., including word line segments) and bit lines usually represent orthogonal array lines, and generally follow a common assumption in the art that word lines are driven and bit lines are sensed, at least during a read operation. Moreover, as used herein, a "global line" (e.g., a global select line) is an array line that spans more than one memory block, but no particular inference should be drawn suggesting such a global line must traverse across an entire memory array or substantially across an entire integrated circuit.

Although certain embodiments described above utilize a plurality of decoded RDEC lines, it should be appreciated that the present invention is useful with embodiments using only a single RDEC line. In addition, voltage polarity "duals" of the described embodiments are also specifically contemplated. For example, other circuits having power supplies inverted from those shown here, and/or having various nodes with inverted polarities, may be employed. As used herein, coupling includes both direct and indirect (i.e., through intervening structures or node) coupling. Moreover, as used herein, particularly in the context of a breakdown voltage, a first voltage that is at most 75% of a second voltage, or is at least 2 volts lower than the second voltage, may be viewed as being "substantially less than" the second voltage. As used herein, a "bias node" is a node conveying a voltage. Examples include, without limitation, a power supply node, a ground node, the output of decoder circuit, the output of a voltage reference generator, etc.

As used herein, "selected" lines, such as selected bit lines within an array block, correspond to such bit lines that are simultaneously selected by a multi-headed decoder circuit, and each coupled to a corresponding bus line. Such bit lines may or may not also be selected by data or I/O circuits to actually perform a given read, program, set, reset, or erase operation. For example, if a 16-headed column decoder simultaneously "selects" and couples 16 bit lines to a given bus (e.g., SELN bus), it is contemplated that none of the bit lines, one bit line, more than one bit line, or all the bit lines of this group of 16 bit lines, may actually receive a selected bias condition suitable for the given mode of operation, while the remaining bit lines may receive an unselected bias condition. Such a bus may be described as being a "data-dependent" bus. In other embodiments, there may be more than one such "selected" bias condition conveyed on a given bus, such as when two simultaneously selected memory cells are to be programmed to different data states.

As used herein, a "pull-up" circuit path refers to a circuit for driving a node to a higher voltage level. Likewise, a "pull-down" circuit path refers to a circuit for driving a node to a lower voltage level. Such a "pull-up" circuit path may be present in an upper coupling circuit, or a lower coupling circuit. In other words, a coupling circuit drawn above a given node is not necessarily a pull-up circuit (although it may be for certain modes of operation).

As used herein, the VWW voltage is the highest voltage (i.e., the most positive) used in the decoders and array line drivers, unless otherwise required by the context, and may have a different magnitude for different modes of operation. Such a VWW voltage is typically expected to be generated by a charge pump circuit. The VNN voltage is the lowest voltage (i.e., the most negative) used in the decoders and array line drivers, unless otherwise required by the context, and may have a different magnitude for different modes of operation. Such a VWW voltage is typically expected to be generated by a charge pump circuit, at least for certain modes of operation, and may be connected to a power supply node (e.g., VSS) during other modes of operation.

As used herein, a passive element memory array includes a plurality of 2-terminal memory cells, each connected between an associated X-line (e.g., word line) and an associated Y-line (e.g., bit line). Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. A passive element memory array may be a one-time programmable (i.e., write once) memory array or a read/write (i.e., write many) memory array. Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

Designations herein of a first, second, third, etc. element in the specification do not necessary require the claims to be so interpreted using the same relative numbering of elements. Any alignment of such relative numbering should be taken as coincidental and not controlling.

The directionality of various array lines in the various figures is merely convenient for ease of description of the two groups of crossing lines in the array. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It is believed that the circuits and structures described herein may be formed using the techniques described herein in concert with other well-known circuit and semiconductor fabrication techniques.

A memory system may be viewed as a system that includes at least a memory device that provides data storage. Memory systems (i.e., memory cards) are commonly used to store digital data for use with various electronic products. The memory system is often removable from the electronic system so the stored digital data is portable. The memory systems according to the invention can have a relatively small form factor and be used to store digital data for electronics products (e.g., consumer electronic products) that acquire data, such as cameras, hand-held or notebook computers, network cards, network appliances, set-top boxes, hand-held or other small media (e.g., audio) players/recorders (e.g., MP3 devices), personal digital assistants, mobile telephones, and medical monitors. The embodiments described above may be incorporated with advantage into an electronic system that includes a memory system.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, packaged modules including such circuits, systems utilizing such circuits and/or modules and/or other memory devices, related methods of operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A decoder circuit comprising:
a first bias node for conveying a first selected voltage for a first mode of operation and a second selected voltage for a second mode of operation, said first bias node traversing and associated with a plurality of decoder output driver circuits;
a second bias node for conveying a first unselected voltage for the first mode of operation and a second unselected voltage for the second mode of operation, said second bias node traversing and associated with the plurality of decoder output driver circuits;
each of the plurality of decoder output driver circuits respectively comprising:
a decoder output node;
a first coupling circuit for coupling the decoder output node, when selected, to the first bias node; and
a second coupling circuit coupled in series with a third coupling circuit, said second and third coupling circuits for coupling the decoder output node, when unselected in the first mode of operation, to the first unselected voltage conveyed on the second bias node and, when unselected in the second mode of operation, to the second unselected voltage conveyed on the second bias node, and for limiting the respective voltage across each of said second and third coupling circuits when the decoder output node is selected in each of the first and second modes of operation, to a value less than the difference between the first selected voltage and the first unselected voltage in the first mode of operation, and to a value less than the difference between the second selected voltage and the second unselected voltage in the second mode of operation.

2. The circuit as recited in claim 1 wherein:
the respective voltage across the second and third coupling circuits, for a selected decoder output, is limited to a value substantially less than the difference between the first selected voltage and the first unselected voltage in the first mode of operation, and is limited to a value substantially less than the difference between the second selected voltage and the second unselected voltage in the second mode of operation.

3. The circuit as recited in claim 1 wherein:
the first selected voltage is greater than the second selected voltage;
the second unselected voltage is greater than the first unselected voltage;
the first selected voltage is greater than the first unselected voltage; and
the second unselected voltage is greater than the second selected voltage.

4. The circuit as recited in claim 1 wherein each decoder output driver circuit is configured to convey:
in the first mode of operation, a high selected voltage on a selected decoder output and a low unselected voltage on an unselected decoder output; and
in the second mode of operation, a low selected voltage on a selected decoder output and a high unselected voltage on an unselected decoder output.

5. The circuit as recited in claim 1 wherein: the first coupling circuit comprises a first PMOS device in parallel with a first NMOS device;
the second coupling circuit comprises a second NMOS device in parallel with a second PMOS device;
the first PMOS device and the second NMOS device are responsive to a first input signal;
the first NMOS device and the second PMOS device are responsive to a second input signal; and
the first and second input signals comprise complementary signals, in both the first and second modes of operation.

6. The circuit as recited in claim 5 wherein:
the third coupling circuit comprises a third NMOS device in parallel with a third PMOS device; and
the third NMOS device is responsive to a third input signal.

7. The circuit as recited in claim 6 wherein, in the first mode of operation:

the third input signal is biased at a voltage between the first selected voltage and the first unselected voltage to limit the voltage across the second coupling circuit to a value less than the difference between the first selected voltage and the first unselected voltage when a selected decoder output node is at the first selected voltage.

8. The circuit as recited in claim 6 wherein:

the third PMOS device is responsive to a fourth input signal;

in the first mode of operation, one of the third and fourth input signals is biased at a voltage between the first selected voltage and the first unselected voltage, and the other of the third and fourth input signals is biased at one of the first selected voltage and the first unselected voltage; and in the second mode of operation, one of the third and fourth input signals is biased at one of the second selected voltage and the second unselected voltage, and the other of the third and fourth input signals is biased at the other of the second selected voltage and the second unselected voltage.

9. The circuit as recited in claim 8 wherein:

in the first mode of operation, the third input signal is biased at a voltage between the first selected voltage and the first unselected voltage, and the fourth input signal is biased at the first selected voltage; and in the second mode of operation, the third input signal is biased at the second unselected voltage, and the fourth input signal is biased at the second selected voltage.

10. The circuit as recited in claim 1 wherein:

the first and second modes of operation comprise respective first and second write modes.

11. The circuit as recited in claim 10 wherein:

the first and second modes of operation respectively comprise a set mode of operation and a reset mode of operation.

12. The circuit as recited in claim 1 wherein each decoder output driver circuit further comprises:

a fourth coupling circuit coupled in series with the first coupling circuit, said first and fourth coupling circuits for limiting the respective voltage across each of said first and fourth coupling circuits when the decoder output node is unselected in each of the first and second modes of operation, and for coupling the decoder output node, when selected in the first mode of operation, to the first selected voltage conveyed on the first bias node and, when selected in the second mode of operation, to the second selected voltage conveyed on the first bias node.

13. The circuit as recited in claim 12 wherein:

the respective voltage across the first and fourth coupling circuits, for an unselected decoder output, is limited to a value substantially less than the difference between the first selected voltage and the first unselected voltage in the first mode of operation, and is limited to a value substantially less than the difference between the second selected voltage and the second unselected voltage in the second mode of operation.

14. The circuit as recited in claim 12 wherein:

the first coupling circuit comprises a first NMOS device in parallel with a first PMOS device;

the second coupling circuit comprises a second NMOS device in parallel with a second PMOS device;

the third coupling circuit comprises a third NMOS device in parallel with a third PMOS device; and the fourth coupling circuit comprises a fourth NMOS device in parallel with a fourth PMOS device.

15. The circuit as recited in claim 14 wherein:

the first PMOS device, the second NMOS device, and the fourth PMOS device are responsive to a first input signal;

the first NMOS device, the second PMOS device, and the third PMOS device are responsive to a second input signal;

the third NMOS device is responsive to a third input signal; and the fourth NMOS device is responsive to a fourth input signal.

16. The circuit as recited in claim 14 wherein:

when the decoder output node and the first bias node are at different voltages, in both the first and second modes of operation, one of the first and fourth NMOS transistors is responsive to an intermediate voltage having a value between the respective voltages of the decoder output node and the first bias node.

17. The circuit as recited in claim 16 wherein:

if the voltage of the first bias node is greater than the voltage of the decoder output node, the intermediate voltage is coupled to the gate terminal of the fourth NMOS transistor; and if the voltage of the first bias node is less than the voltage of the decoder output node, the intermediate voltage is coupled to the gate terminal of the first NMOS transistor.

18. The circuit as recited in claim 14 wherein:

when the decoder output node and the second bias node are at different voltages, in both the first and second modes of operation, one of the second and third NMOS transistors is responsive to an intermediate voltage having a value between the respective voltages of the decoder output node and the second bias node.

19. The circuit as recited in claim 16 wherein:

if the voltage of the second bias node is greater than the voltage of the decoder output node, the intermediate voltage is coupled to the gate terminal of the second NMOS transistor; and if the voltage of the second bias node is less than the voltage of the decoder output node, the intermediate voltage is coupled to the gate terminal of the third NMOS transistor.

20. The circuit as recited in claim 12 wherein:

the first and fourth coupling circuits operate to provide, in the first mode of operation, a pull-up path for driving a selected decoder output node fully to the first select voltage conveyed on the first bias node when the first select voltage is greater than the first unselect voltage, and operate to provide, in the second mode of operation, a pull-down path for driving a selected decoder output node fully to the second select voltage conveyed on the first bias node when the second select voltage is less than the second unselect voltage; and the second and third coupling circuits operate to provide, in the first mode of operation, a pull-down path for driving an unselected decoder output node fully to the first unselect voltage conveyed on the second bias node when the first unselect voltage is less than the first select voltage, and operate to provide, in the second mode of operation, a pull-up path for driving an unselected decoder output node fully to the second unselect voltage conveyed on the second bias node when the second unselect voltage is greater than the second select voltage.

21. The circuit as recited in claim 20 wherein:
the first, second, third, and fourth coupling circuits require no input signals having voltages outside the range defined by the select voltage and the unselect voltage for a given mode of operation.

22. The circuit as recited in claim 1 further comprising:
a plurality of first bias nodes for conveying on a selected one of such first bias nodes the first selected voltage for the first mode of operation and the second selected voltage for the second mode of operation, and for conveying on unselected ones of such first bias nodes the first unselected voltage for the first mode of operation and the second unselected voltage for the second mode of operation; and
respective pluralities of decoder output driver circuits, each respective plurality associated with a respective one of the plurality of first bias nodes.

23. The circuit as recited in claim 22 further comprising:
a first predecoder and bias circuit, responsive to a plurality of first address signals, for generating the plurality of first bias nodes.

24. The circuit as recited in claim 23 further comprising:
a second predecoder circuit, responsive to a plurality of second address signals, for generating a plurality of decoded signals for a group of associated decoder output driver circuits, each coupled to a respective one of the plurality of first bias nodes.

25. The circuit as recited in claim 22 wherein each decoder output driver circuit further comprises:
a fourth coupling circuit coupled in series with the first coupling circuit, said first and fourth coupling circuits for limiting the respective voltage across each of said first and fourth coupling circuits when the decoder output node is unselected in each of the first and second modes of operation, and for coupling the decoder output node, when selected in the first mode of operation, to the first selected voltage conveyed on the associated first bias node and, when selected in the second mode of operation, to the second selected voltage conveyed on the associated first bias node.

26. The circuit as recited in claim 25 wherein:
the first and fourth coupling circuits operate to provide, in the first mode of operation, a pull-up path for driving a selected decoder output node fully to the first select voltage conveyed on the associated first bias node when the first select voltage is greater than the first unselect voltage, and operate to provide, in the second mode of operation, a pull-down path for driving a selected decoder output node fully to the second select voltage conveyed on the associated first bias node when the second select voltage is less than the second unselect voltage; and
the second and third coupling circuits operate to provide, in the first mode of operation, a pull-down path for driving an unselected decoder output node fully to the first unselect voltage conveyed on the second bias node when the first unselect voltage is less than the first select voltage, and operate to provide, in the second mode of operation, a pull-up path for driving an unselected decoder output node fully to the second unselect voltage conveyed on the second bias node when the second unselect voltage is greater than the second select voltage.

27. The circuit as recited in claim 24 further comprising:
a respective group of decoder output driver circuits sharing a respective decoded control signal with each respective one of the plurality of decoder output driver circuits, thereby forming a multi-headed decoder circuit.

28. A decoder circuit comprising:
a first plurality of decoder output driver circuits, each respectively comprising:
a first transfer gate circuit coupled between a respective decoder output node and a first bias node traversing and associated with the first plurality of decoder output driver circuits;
a second transfer gate circuit coupled between a first intermediate node and a second bias node traversing and associated with the first plurality of decoder output driver circuits; and
a third transfer gate circuit coupled between the respective decoder output node and the first intermediate node.

29. The circuit as recited in claim 28 wherein:
each transfer gate circuit respectively comprises a PMOS device in parallel with an NMOS device.

30. The circuit as recited in claim 28 wherein:
the first bias node conveys a high selected voltage for the first mode of operation and a low selected voltage for the second mode of operation; and
the second bias node conveys a low unselected voltage for the first mode of operation and a high unselected voltage for the second mode of operation.

31. The circuit as recited in claim 28 further comprising:
a respective group of decoder output driver circuits sharing a respective decoded control signal with each respective one of the plurality of decoder output driver circuits, thereby forming a multi-headed decoder circuit.

32. The circuit as recited in claim 28 wherein each of the first plurality of decoder output driver circuits further comprises:
a fourth transfer gate circuit coupled between the first bias node and the first transfer gate circuit, defining a second intermediate node therebetween.

33. A decoder circuit comprising:
a first bias node for conveying a first selected voltage for a first mode of operation and a second selected voltage for a second mode of operation, said first bias node traversing and associated with a plurality of decoder output driver circuits;
a second bias node for conveying a first unselected voltage for the first mode of operation and a second unselected voltage for the second mode of operation, said second bias node traversing and associated with the plurality of decoder output driver circuits;
each of the plurality of decoder output driver circuits respectively comprising:
a decoder output node;
select means for coupling the decoder output node, when selected, to the first bias node;
unselect means for coupling the decoder output node, when unselected in the first mode of operation, to the first unselected voltage conveyed on the second bias node and, when unselected in the second mode of operation, to the second unselected voltage conveyed on the second bias node; and
means for limiting the respective voltage across individual devices in the unselect means to a value less than the device breakdown voltage, when the difference between the respective selected and unselected voltages for a respective mode of operation is greater than the device breakdown voltage.

34. The circuit as recited in claim 33 further comprising:
means for limiting the respective voltage across individual devices in the unselect means, for a selected decoder output, to a value substantially less than the difference between the first selected voltage and the first unselected voltage in the first mode of operation, and to a value substantially less than the difference between the second selected voltage and the second unselected voltage in the second mode of operation.

35. The circuit as recited in claim 33 wherein:
the first selected voltage is greater than the second selected voltage;
the second unselected voltage is greater than the first unselected voltage;
the first selected voltage is greater than the first unselected voltage; and
the second unselected voltage is greater than the second selected voltage.

36. The circuit as recited in claim 33 wherein:
the first and second modes of operation comprise respective first and second write modes.

37. The circuit as recited in claim 33 wherein:
the select means comprises means for coupling the decoder output node, when selected in the first mode of operation, to the first selected voltage conveyed on the first bias node and, when selected in the second mode of operation, to the second selected voltage conveyed on the first bias node; and
said decoder circuit further comprising means for limiting the respective voltage across individual devices in the select means to a value less than the device breakdown voltage, when the difference between the respective selected and unselected voltages for a respective mode of operation is greater than the device breakdown voltage.

38. The circuit as recited in claim 37 further comprising:
means for limiting the respective voltage across individual devices in the select means, for an unselected decoder output, to a value substantially less than the difference between the first selected voltage and the first unselected voltage in the first mode of operation, and to a value substantially less than the difference between the second selected voltage and the second unselected voltage in the second mode of operation.

39. The circuit as recited in claim 37 wherein:
the select means provides, in the first mode of operation, a pull-up path for driving a selected decoder output node fully to the first select voltage conveyed on the first bias node when the first select voltage is greater than the first unselect voltage, and provides, in the second mode of operation, a pull-down path for driving a selected decoder output node fully to the second select voltage conveyed on the first bias node when the second select voltage is less than the second unselect voltage; and
the unselect means provides, in the first mode of operation, a pull-down path for driving an unselected decoder output node frilly to the first unselect voltage conveyed on the second bias node when the first unselect voltage is less than the first select voltage, and provides, in the second mode of operation, a pull-up path for driving an unselected decoder output node fully to the second unselect voltage conveyed on the second bias node when the second unselect voltage is greater than the second select voltage.

40. The circuit as recited in claim 39 wherein:
the select and unselect means comprise no circuit nodes having a voltage outside the range defined by the select voltage and the unselect voltage for a given mode of operation.

41. The circuit as recited in claim 33 further comprising:
a plurality of first bias nodes for conveying on a selected one of such first bias nodes the first selected voltage for the first mode of operation and the second selected voltage for the second mode of operation, and for conveying on unselected ones of such first bias nodes the first unselected voltage for the first mode of operation and the second unselected voltage for the second mode of operation; and
respective pluralities of decoder output driver circuits, each respective plurality associated with a respective one of the plurality of first bias nodes.

42. The circuit as recited in claim 41 wherein, for each decoder output driver circuit:
the select means comprises means for coupling the decoder output node, when selected in the first mode of operation, to the first selected voltage conveyed on the associated first bias node and, when selected in the second mode of operation, to the second selected voltage conveyed on the associated first bias node; and
the decoder output driver circuit further comprises means for limiting the respective voltage across individual devices in the select means to a value less than the device breakdown voltage, when the difference between the respective selected and unselected voltages for a respective mode of operation is greater than the device breakdown voltage.

43. The circuit as recited in claim 42 wherein:
the select means provides, in the first mode of operation, a pull-up path for driving a selected decoder output node fully to the first select voltage conveyed on the associated first bias node when the first select voltage is greater than the first unselect voltage, and provides, in the second mode of operation, a pull-down path for driving a selected decoder output node fully to the second select voltage conveyed on the associated first bias node when the second select voltage is less than the second unselect voltage; and
the unselect means provides, in the first mode of operation, a pull-down path for driving an unselected decoder output node fully to the first unselect voltage conveyed on the second bias node when the first unselect voltage is less than the first select voltage, and provides, in the second mode of operation, a pull-up path for driving an unselected decoder output node fully to the second unselect voltage conveyed on the second bias node when the second unselect voltage is greater than the second select voltage.

* * * * *

UNITED STATES PATENT AND TRADEMARK OFFICE
CERTIFICATE OF CORRECTION

PATENT NO. : 7,542,370 B2
APPLICATION NO. : 11/618844
DATED : June 2, 2009
INVENTOR(S) : Tianhong Yan et al.

It is certified that error appears in the above-identified patent and that said Letters Patent is hereby corrected as shown below:

Col. 33, line 53, please replace "frilly" with --fully--

Signed and Sealed this

First Day of September, 2009

David J. Kappos
*Director of the United States Patent and Trademark Office*